(12) United States Patent
Kawashima et al.

(10) Patent No.: US 12,355,019 B2
(45) Date of Patent: Jul. 8, 2025

(54) DISPLAY APPARATUS AND ELECTRONIC DEVICE

(71) Applicant: Semiconductor Energy Laboratory Co., Ltd., Atsugi (JP)

(72) Inventors: Susumu Kawashima, Atsugi (JP); Koji Kusunoki, Isehara (JP); Kazunori Watanabe, Machida (JP); Satoshi Yoshimoto, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/026,634

(22) PCT Filed: Sep. 14, 2021

(86) PCT No.: PCT/IB2021/058328
§ 371 (c)(1),
(2) Date: Mar. 16, 2023

(87) PCT Pub. No.: WO2022/069980
PCT Pub. Date: Apr. 7, 2022

(65) Prior Publication Data
US 2023/0335050 A1    Oct. 19, 2023

(30) Foreign Application Priority Data

Oct. 1, 2020   (JP) .................. 2020-166887

(51) Int. Cl.
*G09G 3/3225*   (2016.01)
*H01L 25/16*    (2023.01)
(Continued)

(52) U.S. Cl.
CPC ......... *H01L 25/167* (2013.01); *G09G 3/3225* (2013.01); *H10H 29/142* (2025.01);
(Continued)

(58) Field of Classification Search
CPC .. G09G 3/3225; G09G 3/3233; G09G 3/3258; G09G 3/2022; G09G 3/2014;
(Continued)

(56) References Cited

U.S. PATENT DOCUMENTS 7,180,245 B2 *   2/2007   Yamazaki ............ G09G 3/3258
                                          257/E27.111
7,358,935 B2     4/2008   Yamashita et al.
(Continued)

FOREIGN PATENT DOCUMENTS

CN    001698084 A    11/2005
CN    001901008 A    1/2007
(Continued)

OTHER PUBLICATIONS

Goshi Biwa et al., "Commercialization of the Crystal LED Display System Using Micro LEDs to Realize Scalable and High-Quality Images", The Journal of The Institute of Image Information and Television Engineers 2020, vol. 74, No. 1, pp. 174-179, The Institute of Image Information and Television Engineers.
(Continued)

*Primary Examiner* — Nitin Patel
*Assistant Examiner* — Amen W Bogale
(74) *Attorney, Agent, or Firm* — Eric J. Robinson; Robinson Intellectual Property Law Office, P.C.

(57) ABSTRACT

A display apparatus including a pixel circuit that generates a PWM signal is provided. In the display apparatus, a pixel has a function of generating a PWM signal. The PWM signal can be generated by an operation of comparing gate-source voltage or on-state resistance of each of two transistors provided in the pixel. Light emission of a light-emitting device such as a micro LED or an organic EL element is controlled with a duty ratio using the generated PWM signal. The PWM signal is generated in a circuit formed of a small
(Continued)

number of transistors, which is effective in increasing the definition and the area of the display apparatus.

10 Claims, 26 Drawing Sheets

(51) Int. Cl.
*H10H 29/14* (2025.01)
*H10K 59/121* (2023.01)
*H10K 59/131* (2023.01)

(52) U.S. Cl.
CPC ....... *H10K 59/1213* (2023.02); *H10K 59/131* (2023.02); *G09G 2300/0819* (2013.01); *G09G 2300/0842* (2013.01); *G09G 2310/08* (2013.01); *G09G 2320/02* (2013.01); *G09G 2320/064* (2013.01); *G09G 2330/021* (2013.01)

(58) Field of Classification Search
CPC ... G09G 2300/0842; G09G 2300/0426; G09G 2300/0861; G09G 2300/0819; G09G 2300/0852; G09G 2300/0833; G09G 2300/0809; G09G 2310/08; G09G 2310/066; G09G 2310/0259; G09G 2320/02; G09G 2320/064; G09G 2320/0242; G09G 2330/021; G09F 9/30; G09F 9/33; H10K 59/1213; H10K 59/131; H01L 25/0753; H01L 25/167; H10D 30/67; H10H 20/857; H10H 29/142; H10H 20/00; H10H 29/00; H10H 99/00

See application file for complete search history.

(56) References Cited

U.S. PATENT DOCUMENTS

| | | | |
|---|---|---|---|
| 7,639,211 B2 | 12/2009 | Miyazawa | |
| 7,674,650 B2 | 3/2010 | Akimoto et al. | |
| 8,144,081 B2 | 3/2012 | Miyazawa | |
| 10,395,594 B1 | 8/2019 | Charisoulis et al. | |
| 10,455,653 B1* | 10/2019 | Watanabe | G09G 3/32 |
| 11,783,760 B2* | 10/2023 | Wu | G09G 3/32 |
| | | | 345/55 |
| 2002/0105506 A1* | 8/2002 | Hiyama | H04N 19/103 |
| | | | 375/E7.137 |
| 2003/0058687 A1 | 3/2003 | Kimura | |
| 2003/0103022 A1 | 6/2003 | Noguchi et al. | |
| 2004/0207614 A1 | 10/2004 | Yamashita et al. | |
| 2005/0062106 A1* | 3/2005 | Noguchi | H10D 86/0251 |
| | | | 257/347 |
| 2005/0156828 A1* | 7/2005 | Yamashita | G09G 3/3258 |
| | | | 345/76 |
| 2006/0125412 A1* | 6/2006 | Shih | G09G 3/325 |
| | | | 315/169.4 |
| 2007/0018078 A1* | 1/2007 | Miyazawa | H03F 3/08 |
| | | | 250/214 R |
| 2007/0236440 A1* | 10/2007 | Wacyk | G09G 3/3241 |
| | | | 345/92 |
| 2008/0203930 A1 | 8/2008 | Budzelaar et al. | |
| 2009/0121642 A1 | 5/2009 | Ceballos | |
| 2011/0050761 A1 | 3/2011 | Yoneyama | |
| 2013/0082906 A1 | 4/2013 | Toyomura et al. | |
| 2014/0367705 A1 | 12/2014 | Bibl et al. | |
| 2015/0243220 A1 | 8/2015 | Kim et al. | |
| 2016/0096725 A1* | 4/2016 | Umezaki | H10D 84/811 |
| | | | 257/72 |
| 2018/0182294 A1* | 6/2018 | Radhakrishnan | G09G 3/3241 |
| 2018/0197474 A1* | 7/2018 | Jeon | H10D 86/471 |
| 2018/0240421 A1* | 8/2018 | Yamazaki | H10D 99/00 |
| 2018/0293929 A1 | 10/2018 | Shigeta et al. | |
| 2018/0301080 A1* | 10/2018 | Shigeta | G09G 3/32 |
| 2019/0371231 A1 | 12/2019 | Kim et al. | |
| 2020/0043405 A1* | 2/2020 | Akimoto | G09G 3/32 |
| 2021/0065616 A1 | 3/2021 | Kim et al. | |
| 2021/0158747 A1 | 5/2021 | Kusunoki et al. | |
| 2021/0174734 A1 | 6/2021 | Takahashi et al. | |
| 2021/0366368 A1* | 11/2021 | Watanabe | H10D 86/60 |
| 2021/0407380 A1 | 12/2021 | Liu et al. | |
| 2022/0005790 A1 | 1/2022 | Watanabe et al. | |
| 2022/0068197 A1* | 3/2022 | Kawae | G09G 3/3233 |
| 2022/0199001 A1* | 6/2022 | Kim | G09G 3/3233 |

FOREIGN PATENT DOCUMENTS

| | | |
|---|---|---|
| CN | 101437341 A | 5/2009 |
| CN | 103035189 A | 4/2013 |
| DE | 102008054150 | 5/2009 |
| EP | 1439520 A | 7/2004 |
| EP | 1455335 A | 9/2004 |
| JP | 2003-241711 A | 8/2003 |
| JP | 2004-198683 A | 7/2004 |
| JP | 2004-246320 A | 9/2004 |
| JP | 2007-025523 A | 2/2007 |
| JP | 2007-096055 A | 4/2007 |
| JP | 2007-123861 A | 5/2007 |
| JP | 2008-541185 | 11/2008 |
| JP | 2011-039540 A | 2/2011 |
| JP | 2013-076812 A | 4/2013 |
| KR | 2007-0012232 A | 1/2007 |
| TW | 202004723 | 1/2020 |
| WO | WO-2003/052728 | 6/2003 |
| WO | WO-2007/120475 | 10/2007 |
| WO | WO-2019/220275 | 11/2019 |
| WO | WO-2023/079404 | 5/2023 |

OTHER PUBLICATIONS

International Search Report (Application No. PCT/IB2021/058328) Dated Dec. 21, 2021.
Written Opinion (Application No. PCT/IB2021/058328) Dated Dec. 21, 2021.
Wang. T et al., "A New PWM Pixel Circuit for Micro-LED Display with 60Hz Driving and 120Hz Lighting", SID Digest '20 : SID International Symposium Digest of Technical Papers, Sep. 25, 2020, vol. 51, No. 1, pp. 1707-1710.

* cited by examiner

Vsweep−DVSS < Vdata_H−V0

FIG. 26A
FIG. 26B
FIG. 26C
FIG. 26D
FIG. 26E
FIG. 26F
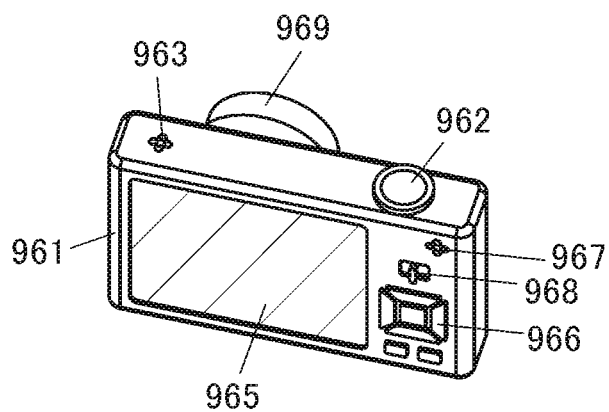
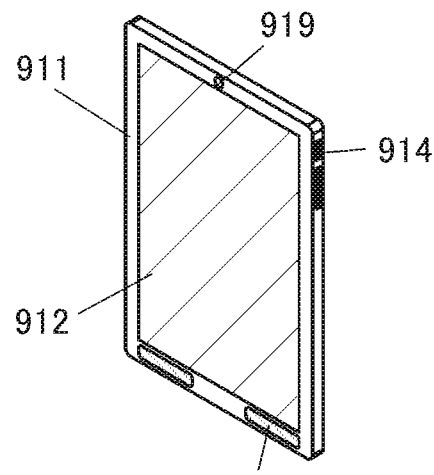
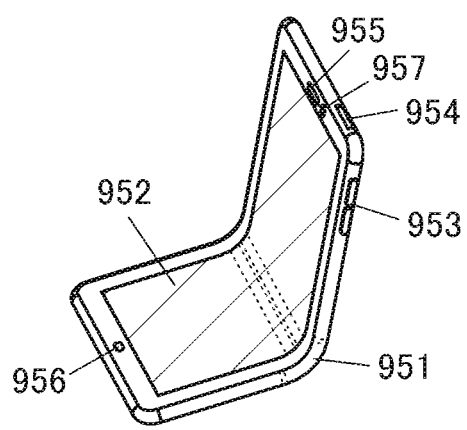
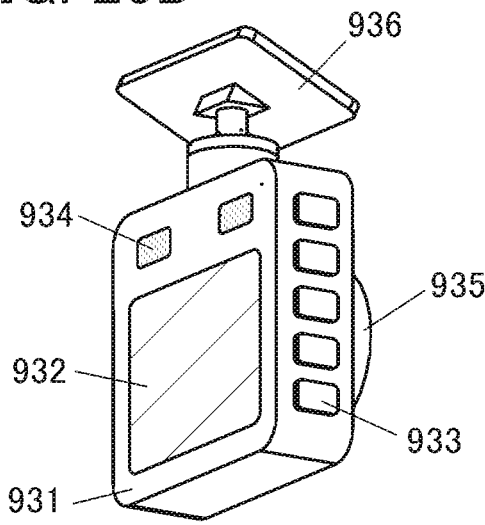
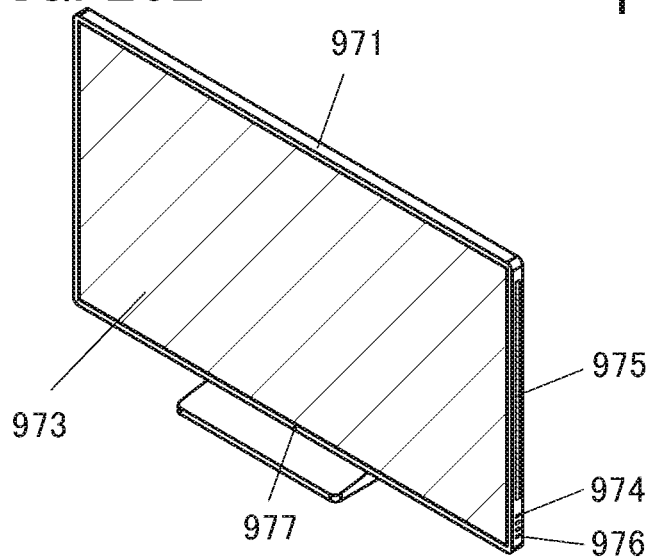
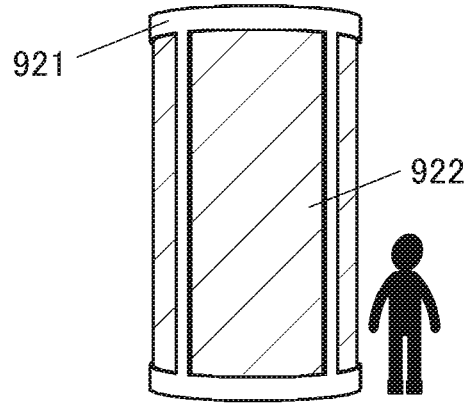

DISPLAY APPARATUS AND ELECTRONIC DEVICE

TECHNICAL FIELD

One embodiment of the present invention relates to a display apparatus.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Accordingly, more specific examples of the technical field of one embodiment of the present invention disclosed in this specification include a semiconductor device, a display apparatus, a liquid crystal display apparatus, a light-emitting device, a lighting device, a power storage device, a memory device, an imaging device, an operation method thereof, and a manufacturing method thereof.

Note that in this specification and the like, a semiconductor device generally means a device that can function by utilizing semiconductor characteristics. A transistor and a semiconductor circuit are embodiments of semiconductor devices. In addition, in some cases, a memory device, a display apparatus, an imaging device, or an electronic device includes a semiconductor device.

BACKGROUND ART

In recent years, a display apparatus and a lighting device including a micro light-emitting diode (hereinafter, referred to as a micro LED (LED: Light Emitting Diode)) have been proposed (e.g., Patent Document 1). A display apparatus including a micro LED is capable of displaying with high luminance and has high reliability, and thus is promising as a next-generation display.

A technique for forming transistors using a metal oxide formed over a substrate has been attracting attention. For example, Patent Document 2 and Patent Document 3 each disclose a technique in which a transistor formed using zinc oxide or an In—Ga—Zn-based oxide is used as a switching element or the like of a pixel in a display apparatus.

REFERENCE

Patent Document

[Patent Document 1] Specification of United States Patent Application Publication No. 2014/0367705
[Patent Document 2] Japanese Published Patent Application No. 2007-123861
[Patent Document 3] Japanese Published Patent Application No. 2007-96055

SUMMARY OF THE INVENTION

Problems to be Solved by the Invention

In a display apparatus using a light-emitting device (also referred to as a light-emitting element), luminance is changed by controlling current flowing to the light-emitting device. However, the characteristic of an LED that is one of light-emitting devices is that the chromaticity is likely to change in accordance with the current density. Thus, in drive of an LED, display is preferably performed by pulse width modulation (PWM) control with a constant current value. Using the PWM control makes it possible to obtain desired luminance without occurrence of chromaticity deviation.

In general, a PWM signal is generated using a comparator. Accordingly, to generate the PWM signal, a Si wafer is used as a substrate and a pixel circuit including a comparator is formed over the Si wafer in a compact display apparatus such as a microdisplay.

In a display apparatus with a relatively large size, the PWM signal can be generated by mounting an IC chip including a comparator in a pixel. However, there is a problem in that the IC chip cost and the mounting cost are extremely high. Although a CMOS comparator can be formed in a pixel using polycrystalline silicon or the like formed over an insulating substrate, this is not suitable for high resolution because the number of transistors and the number of wirings are increased.

Accordingly, an object of one embodiment of the present invention is to provide a display apparatus including a pixel circuit that generates a PWM signal with a small number of transistors. Another object is to provide a display apparatus including a pixel circuit that generates a PWM signal only with transistors having the same conductivity type. Another object is to provide a display apparatus having excellent display characteristics. Another object is to provide an inexpensive display apparatus.

Another object is to provide a display apparatus with low power consumption. Another object is to provide a highly reliable display apparatus. Another object is to provide a novel display apparatus or the like. Another object is to provide a method for operating the display apparatus. Another object is to provide a novel semiconductor device or the like.

Note that the description of these objects does not preclude the existence of other objects. Note that one embodiment of the present invention does not need to achieve all the objects. Note that other objects will be apparent from the description of the specification, the drawings, the claims, and the like, and other objects can be derived from the description of the specification, the drawings, the claims, and the like.

Means for Solving the Problems

One embodiment of the present invention relates to a display apparatus including a pixel circuit that generates a PWM signal.

A first embodiment of the present invention is a display apparatus including a first transistor, a second transistor, a third transistor, and a light-emitting device. One of a source and a drain of the first transistor is electrically connected to one of a source and a drain of the second transistor and a gate of the third transistor. One of a source and a drain of the third transistor is electrically connected to the light-emitting device. The light-emitting device is turned on when on-state resistance of the first transistor is lower than on-state resistance of the second transistor, and the light-emitting device is turned off when the on-state resistance of the first transistor is higher than the on-state resistance of the second transistor.

A data potential is supplied to a gate of the first transistor, and a signal potential having a ramp wave is supplied to a gate of the second transistor.

It is preferable that the maximum value of the signal potential having the ramp wave be higher than the maximum value possible for the data potential, and the minimum value of the signal potential having the ramp wave be lower than the minimum value possible for the data potential. A cycle of the ramp wave is preferably one frame period.

A second embodiment of the present invention is a display apparatus including a first transistor, a second transistor, a third transistor, a fourth transistor, a fifth transistor, a capacitor, and a light-emitting device in a pixel. One of a source and a drain of the first transistor is electrically connected to a gate of the second transistor and one electrode of the capacitor. One of a source and a drain of the second transistor is electrically connected to the other electrode of the capacitor, one of a source and a drain of the third transistor, a gate of the fourth transistor, and one of a source and a drain of the fifth transistor. One of a source and a drain of the fourth transistor is electrically connected to the light-emitting device.

A third embodiment of the present invention is a display apparatus including a first transistor, a second transistor, a third transistor, a fourth transistor, a capacitor, and a light-emitting device in a pixel. The second transistor is a p-channel transistor. One of a source and a drain of the first transistor is electrically connected to a gate of the second transistor and one electrode of the capacitor. One of a source and a drain of the second transistor is electrically connected to one of a source and a drain of the third transistor and a gate of the fourth transistor. One of a source and a drain of the fourth transistor is electrically connected to the light-emitting device.

In the third embodiment of the present invention, the other electrode of the capacitor can be electrically connected to a power supply line. The second transistor preferably contains silicon in a channel formation region.

In the second embodiment and the third embodiment of the present invention, the light-emitting device is an LED, and one of the source and the drain of the fourth transistor can be electrically connected to a cathode of the LED. Alternatively, the light-emitting device is an organic EL element, and one of the source and the drain of the fourth transistor can be electrically connected to an anode of the organic EL element.

In the second embodiment and the third embodiment of the present invention, it is preferable that the first transistor contain a metal oxide in a channel formation region, and the metal oxide contain In, Zn, and M (M is one or more kinds selected from Al, Ti, Ga, Ge, Sn, Y, Zr, La, Ce, Nd, and Hf).

Effect of the Invention

With the use of one embodiment of the present invention, a display apparatus including a pixel circuit that generates a PWM signal with a small number of transistors can be provided. Alternatively, a display apparatus including a pixel circuit that generates a PWM signal only with transistors having the same conductivity type can be provided. Alternatively, a display apparatus having excellent display characteristics can be provided. Alternatively, an inexpensive display apparatus can be provided.

Alternatively, it is possible to provide a display apparatus with low power consumption. Alternatively, it is possible to provide a highly reliable display apparatus. Alternatively, it is possible to provide a novel display apparatus or the like. Alternatively, it is possible to provide a method for operating the display apparatus. Alternatively, it is possible to provide a novel semiconductor device or the like.

BRIEF DESCRIPTION OF THE DRAWINGS

FIG. 26A to FIG. 26F are diagrams illustrating electronic devices.

MODE FOR CARRYING OUT THE INVENTION

Figure 1:
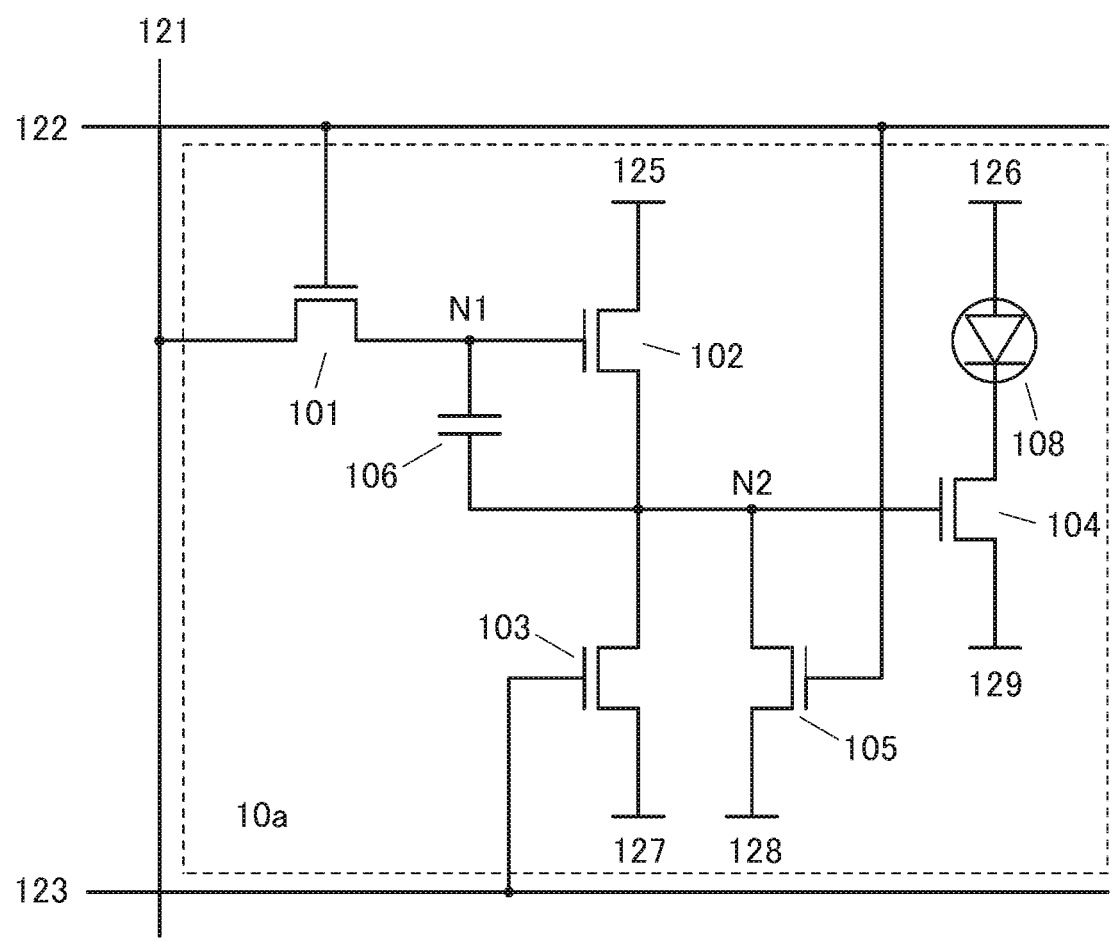
FIG. 1 is a diagram illustrating a pixel circuit.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

In addition, even in the case where a single component is illustrated in a circuit diagram, the component may be composed of a plurality of parts as long as there is no functional inconvenience. For example, in some cases, a plurality of transistors that operate as a switch are connected in series or in parallel. Furthermore, in some cases, capacitors are divided and arranged in a plurality of positions.

In addition, one conductor has a plurality of functions such as a wiring, an electrode, and a terminal in some cases. In this specification, a plurality of names are used for the same component in some cases. Furthermore, even in the case where elements are illustrated in a circuit diagram as if they were directly connected to each other, the elements may actually be connected to each other through one conductor or a plurality of conductors. In this specification, even such a structure is included in the category of direct connection.

Embodiment 1

In this embodiment, a display apparatus according to one embodiment of the present invention is described with reference to drawings.

One embodiment of the present invention is a display apparatus that includes a pixel having a function of generating a PWM signal. The PWM signal can be generated by an operation of comparing on-state resistance of two transistors provided in the pixel. Light emission of a light-emitting device such as an LED or an organic EL element is controlled by the generated PWM signal.

The characteristic of an LED is that the chromaticity changes depending on the current density, whereby control by analog current is not suitable in some cases. Since variation in the threshold voltage (Vth) of a driving transistor influences the luminance in the control by analog current, a Vth correction circuit or the like is incorporated in the pixel in some cases. Luminance is controlled with a duty ratio in a PWM control, so that the influence of the variation in Vth of the driving transistor is small. Moreover, in one embodiment of the present invention, the PWM signal is generated in a circuit formed of a small number of transistors, which is effective in increasing the definition and the area of the display apparatus.

FIG. 1 is a circuit diagram of a pixel included in a display apparatus according to one embodiment of the present invention. A pixel 10a includes a transistor 101, a transistor 102, a transistor 103, a transistor 104, a transistor 105, a capacitor 106, and a light-emitting device 108. Here, the transistor 101 to the transistor 105 can be n-channel transistors. An LED (e.g., a micro LED) is preferably used for the light-emitting device 108.

One of a source and a drain of the transistor 101 is electrically connected to one electrode of the capacitor 106 and a gate of the transistor 102. One of a source and a drain of the transistor 102 is electrically connected to the other electrode of the capacitor 106, one of a source and a drain of the transistor 103, a gate of the transistor 104, and one of a source and a drain of the transistor 105. One of a source and a drain of the transistor 104 is electrically connected to a cathode of the light-emitting device.

Here, a point (wiring) where one of the source and the drain of the transistor 101, the one electrode of the capacitor 106, and the gate of the transistor 102 are connected is referred to as a node N1. A point (wiring) where one of the source and the drain of the transistor 102, the other electrode of the capacitor 106, one of the source and the drain of the transistor 103, and one of the source and the drain of the transistor 105 are connected is referred to as a node N2.

The other of the source and the drain of the transistor 101 is electrically connected to a wiring 121. The other of the source and the drain of the transistor 102 is electrically connected to a wiring 125. The other of the source and the drain of the transistor 103 is electrically connected to a wiring 127. The other of the source and the drain of the transistor 104 is electrically connected to a wiring 129. The other of the source and the drain of the transistor 105 is electrically connected to a wiring 128. An anode of the light-emitting device 108 is electrically connected to a wiring 126. A gate of the transistor 101 and a gate of the transistor 105 are electrically connected to a wiring 122. A gate of the transistor 103 is electrically connected to a wiring 123.

The wiring 121 is a source line that connects the pixel 10a to a source driver for supplying image data. The wiring 125, the wiring 126, the wiring 127, and the wiring 129 are power supply lines, the wiring 125 and the wiring 126 are high potential power supply lines (the wiring 126 is also referred to as an anode wiring, an anode electrode, or a common electrode), and the wiring 127 and the wiring 129 can be low potential power supply lines (the wiring 129 is also referred to as a cathode wiring). The wiring 128 is a wiring for supplying a constant potential.

Note that the wiring 125 and the wiring 126 may be electrically connected to each other. The wiring 127 and the wiring 128 may be electrically connected to each other. The wiring 127, the wiring 128, and the wiring 129 can be electrically connected to each other.

Each of the wiring 122 and the wiring 123 is a gate line that controls the operation of a transistor connected thereto. The wiring 122 can be electrically connected to a gate driver. The wiring 123 can be electrically connected to a ramp wave signal generation circuit.

Here, the transistor 101 functions as a switch. The transistor 102, the transistor 103, and the transistor 105 have a function of generating a PWM signal. The transistor 104 functions as a driving transistor of the light-emitting device 108 and performs a switching operation in accordance with the generated PWM signal. The capacitor 106 functions as a storage capacitor or a bootstrap capacitor.

Next, generation of a PWM signal in the pixel 10a is described. The transistor 102, the transistor 103, and the transistor 105 are used for generating the PWM signal. Here, a high potential (DVDD) for turning on the transistor 104 (the potential can sufficiently reduce on-state resistance) is supplied to the wiring 125. A low potential (DVSS) for turning off the transistor 104 (bringing the transistor 104 in an off state) is supplied to the wiring 127.

A low potential (V0) for resetting the potential of the node N2 is supplied to the wiring 128. Resetting the node N2 (the source of the transistor 102) to V0 enables a gate-source voltage (Vgs) of the transistor 102 to be written properly. Note that in order to reset the node N2 to V0 surely, the transistor 105 preferably has higher on-state current characteristics than the transistor 103.

First, a data potential (Vdata) is supplied to the gate of the transistor 102 (the node N1), and V0 is supplied to the source of the transistor 102 (the node N2). A signal potential having a ramp wave (Vsweep) is supplied to the gate of the transistor 103.

Note that it is preferable that the maximum value of Vsweep be higher than the maximum value possible for Vdata and the minimum value of Vsweep be lower than the minimum value possible for Vdata. When the value of Vsweep is in the range, Vdata can be converted into a PWM signal with high accuracy. Note that for reducing stress of the transistor 103, the minimum value of Vsweep may be a value with which the transistor 103 is turned off.

Vsweep changes over time, and when Vdata-V0 that is Vgs of the transistor 102 is higher than Vsweep-DVSS that is Vgs of the transistor 103, the potential of the node N2 becomes DVDD. Thus, the transistor 104 is turned on and the light-emitting device 108 is turned on (emits light). In contrast, when Vdata-V0 is lower than Vsweep-DVSS, the potential of the node N2 becomes DVSS. Accordingly, the transistor 104 is turned off and the light-emitting device 108 is turned off.

Note that the above is an operation of comparing Vgs of the transistor 102 and Vgs of the transistor 103 and is established on the assumption that both of them have equivalent current characteristics.

When the current characteristics of the transistor 102 and those of the transistor 103 are different from each other, the operation can be expressed as an operation of comparing on-state resistances. That is, when the on-state resistance of the transistor 102 is higher than the on-state resistance of the transistor 103, the potential of the node N2 becomes DVDD. In contrast, when the on-state resistance of the transistor 102 is lower than the on-state resistance of the transistor 103, the potential of the node N2 becomes DVSS.

In the above operation, the time during which the potential of the node N2 becomes DVDD is longer than the time during which it becomes DVSS when Vdata is relatively high, and the time during which the potential of the node N2 becomes DVSS is longer than the time during which it becomes DVDD when Vdata is relatively low. Thus, it can be said that the PWM signals generated with the transistor 102, the transistor 103, and the transistor 105 are supplied to the node N2.

Figure 2:
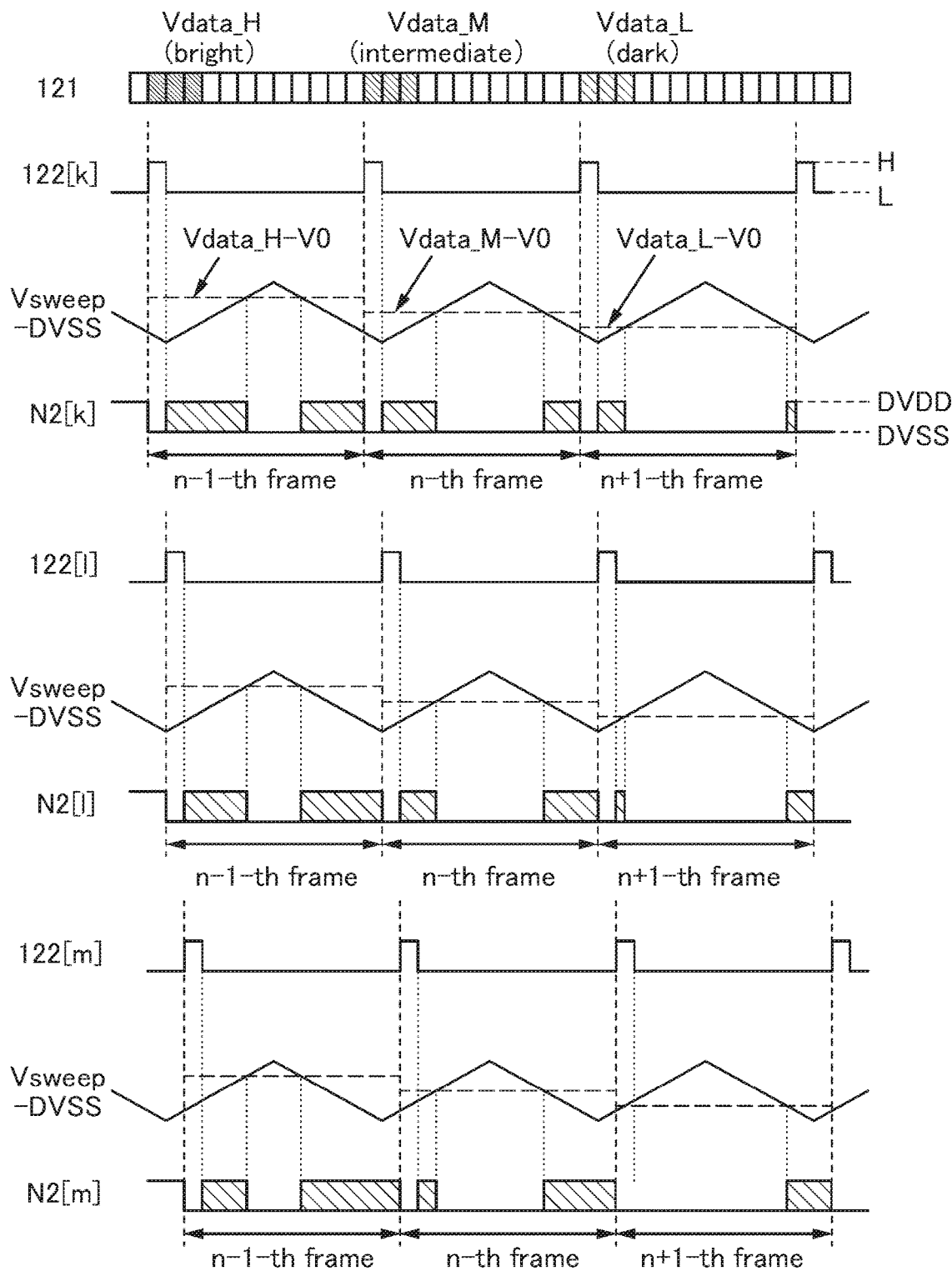
FIG. 2 is a timing chart showing a pixel operation.
Figure 5:
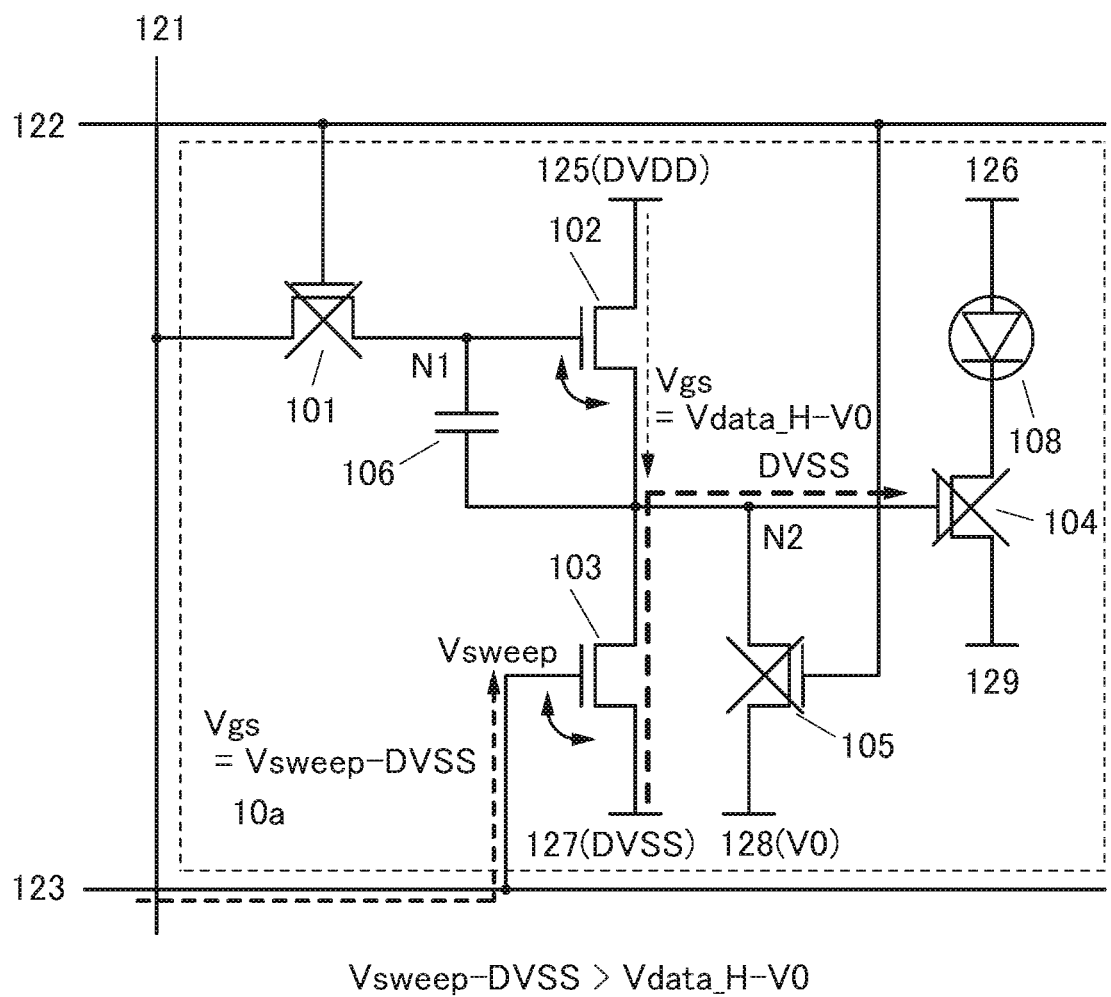
FIG. 5 is a diagram illustrating a pixel operation.
Figure 6:
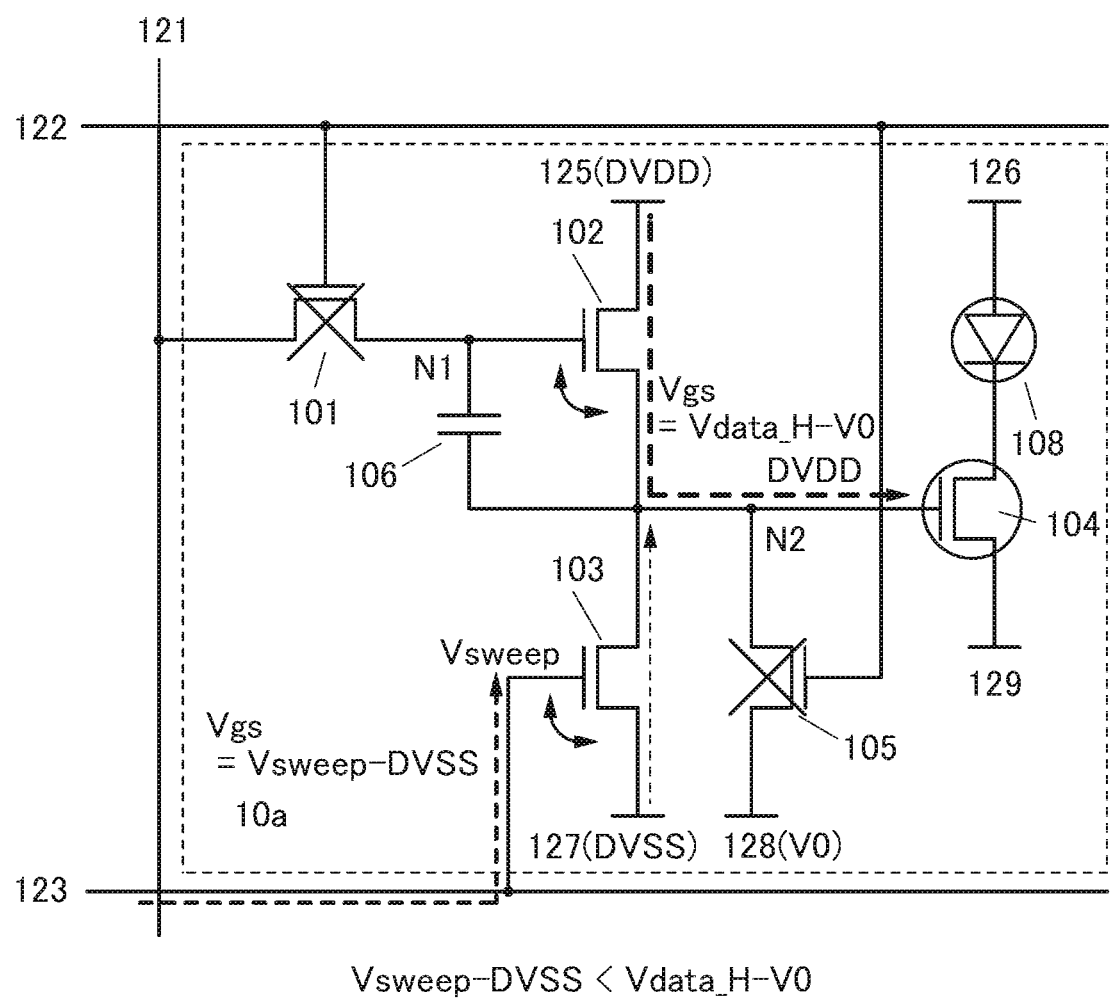
FIG. 6 is a diagram illustrating a pixel operation.

Next, the generation of a PWM signal is described in detail with reference to timing charts shown in FIG. 2 and FIG. 3 and diagrams illustrating circuit operations in FIG. 4 to FIG. 6. Note that FIG. 2 shows the pixels 10*a* arranged in a certain column of three consecutive rows (the k-th row, the l-th row, and the m-th row) as targets. In addition, operations of three consecutive frames (the n−1-th frame to the n+1-th frame; n is an integer greater than or equal to 2) are shown, and PWM signals generated when Vdata_H (bright: high luminance) in the n−1-th frame, Vdata_M (intermediate: intermediate luminance) in the n-th frame, and Vdata_L (dark: low luminance) in the n+1-th frame are written in all the rows are shown.

Vdata_(H, M, or L)-V0 shown in FIG. 2 corresponds to Vgs of the transistor 102. Vsweep-DVSS corresponds to Vgs of the transistor 103. Vsweep is a signal potential having a ramp wave supplied from the wiring 123, and DVSS is a constant power supply potential supplied to the wiring 127. Thus, a waveform of Vsweep-DVSS is equivalent to a waveform of the ramp wave.

Ramp waves having the same phase are supplied to all the pixels. Accordingly, there is no need to generate ramp waves having different phases for each row, so that a circuit that generates a ramp wave and a circuit that supplies the ramp wave can be simplified.

First, generation of a PWM signal in the pixel 10*a* in the k-th row is described. Note that current characteristics of the transistor 102 and those of the transistor 103 are equivalent to each other.

Figure 4:
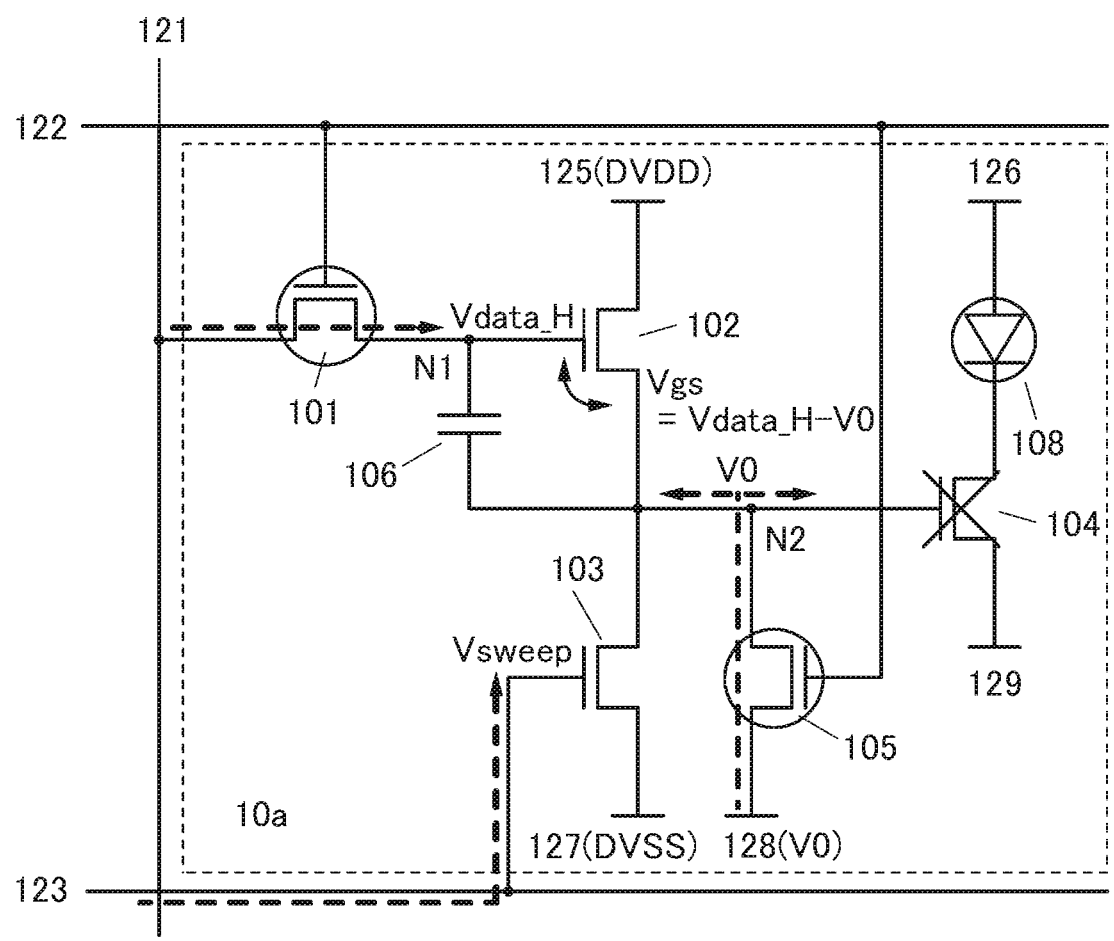
FIG. 4 is a diagram illustrating a pixel operation.

In the n−1-th frame, the potential of a wiring 122[*k*] becomes H (high potential), the transistor 101 and the transistor 105 are turned on and Vdata_H is supplied to the node N1, and V0 is supplied to the node N2 (see FIG. 4). At this time, Vgs of the transistor 102 becomes Vdata_H-V0.

Figure 3A:
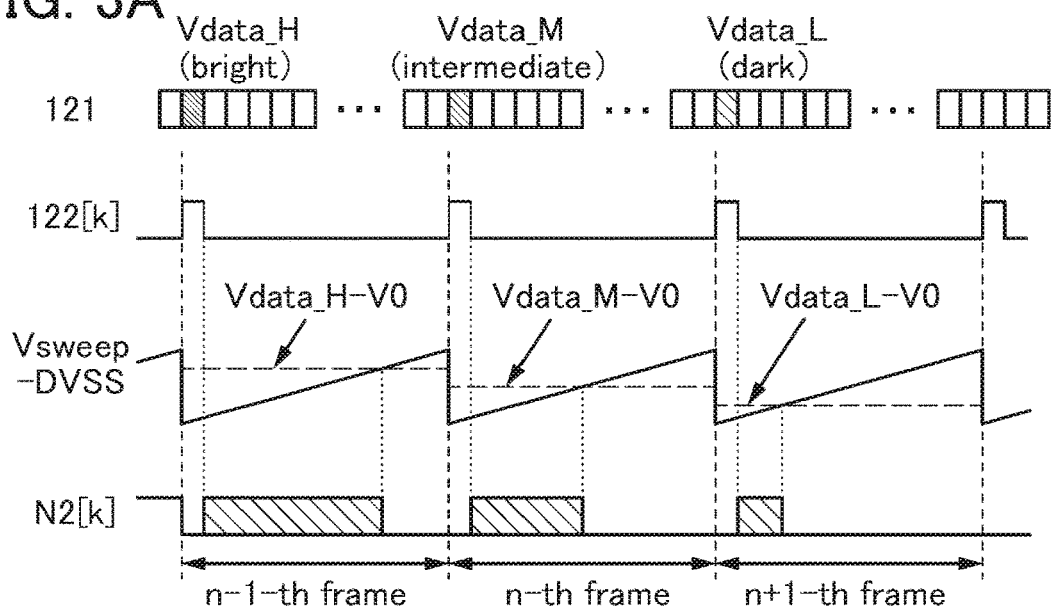
FIG. 3A to FIG. 3C are timing charts each showing a pixel operation.

In parallel with the above operation, a ramp wave is supplied to the wiring 123 (see FIG. 4). For example, the ramp wave can be a triangle wave as shown by Vsweep-DVSS in FIG. 2. Alternatively, the ramp wave can be a sawtooth wave as shown in FIG. 3A. A sine wave, a trapezoidal waveform, or the like can also be used.

The cycle of the ramp wave can be one frame period at the longest as shown in FIG. 2. Since Vdata is retained for one frame period, a one-cycle PWM waveform can be generated when the ramp wave cycle is one frame period. When a ramp waveform cycle is one frame period that is the longest cycle, the number of times of charging and discharging of a wiring for supplying a signal potential with a ramp waveform can be minimized, leading to a reduction in power consumption.

Figure 3B:
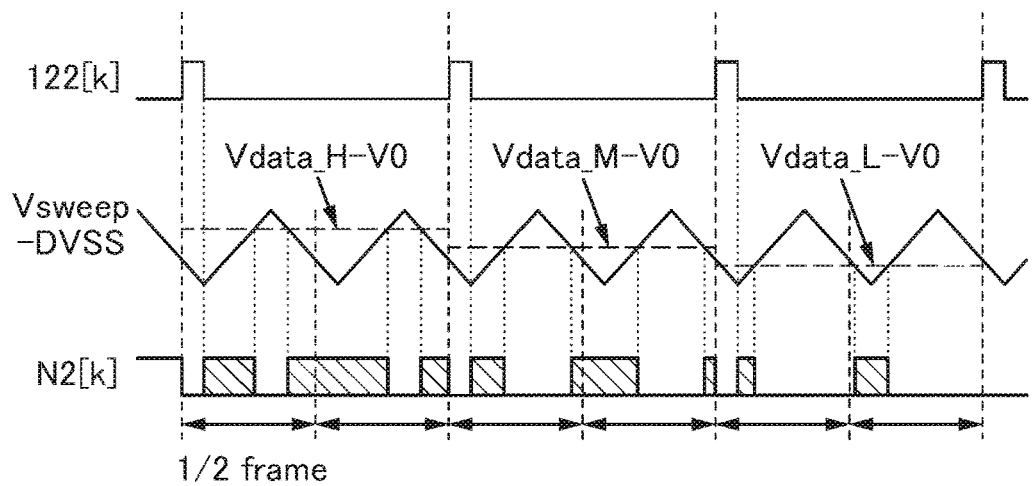
Figure 3C:
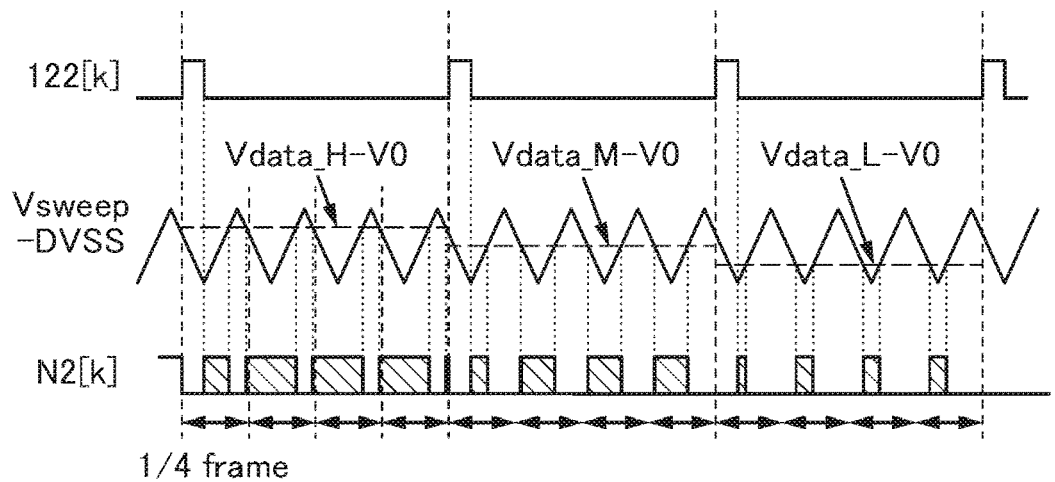

As shown in FIG. 3B and FIG. 3C, the ramp waveform cycle may be a half-frame period or a quarter-frame period. Alternatively, the ramp waveform cycle may be further shortened. PWM control adjusts luminance by dividing a lighting period, and lighting and blinking can be repeated at high speed by shortening the ramp waveform cycle, so that afterimages can be suppressed.

In one frame period, Vdata_H-V0 is constant; however, Vsweep-DVSS changes over time. Accordingly, the period in which DVSS is supplied to the node N2 when Vsweep-DVSS>Vdata_H-V0 (see FIG. 5) and the period in which DVDD is supplied to the node N2 when Vsweep-DVSS<Vdata_H-V0 (see FIG. 6) are generated.

In FIG. 2, since Vdata_H is written in the n−1-th frame, the period in which DVSS is supplied to the node N2 is short and the period in which DVDD is supplied to the node N2 is long. That is, the duty ratio is increased and the average current in one frame period is increased, so that display with high luminance can be performed.

In the n-th frame, Vdata_M is written and Vgs of the transistor 102 becomes Vdata_M-V0. As in the description of the n−1-th frame, an operation of comparing Vdata_M-V0 and Vsweep-DVSS is performed, and the duty ratio is smaller than that in the n−1-th frame.

In the n+1-th frame, Vdata_L is written and Vgs of the transistor 102 becomes Vdata_L-V0. As in the description of the n−1-th frame, an operation of comparing Vdata_L-V0 and Vsweep-DVSS is performed, and the duty ratio is smaller than that in the n-th frame and the average current in one frame period is decreased, so that display with low luminance can be performed.

Next, generation of a PWM signal in the pixel 10*a* in the l-th row is described. In the l-th row, a data potential is written with a delay by one horizontal period behind the k-th row, and the frame period is started. Meanwhile, since the ramp waves are supplied to the wirings 123 with waveforms having the same phase in all the pixels, the timing at which Vsweep-DVSS>Vdata_(H, M, or L)-V0 is satisfied and the timing at which Vsweep-DVSS<Vdata_(H, M, or L)-V0 is satisfied are different even in the case where the same data potential as in the k-th row is written. Note that when the written data potentials are the same, the duty ratios of the generated PWM signals are the same.

The same applies to the m-th row; the timing at which Vsweep-DVSS>Vdata_(H, M, or L)-V0 is satisfied and the timing at which Vsweep-DVSS<Vdata_(H, M, or L)-V0 is satisfied are different even in the case where the same data potential as in the l-th row is written. Note that when the written data potentials are the same, the duty ratios of the generated PWM signals are the same.

Note that in the pixel 10*a* illustrated in FIG. 1, the transistor 101 that writes data to the node N1 and the transistor 105 that resets the node N2 are turned on at the same time. Thus, even when Vsweep-DVSS<Vdata_(H, M, or L)-V0 is satisfied at the time of writing data, the potential of the node N2 becomes V0, and the light-emitting device is turned off in some cases. Note that one horizontal period required for writing data is approximately ¹⁄₁₀₀₀ of one frame period when the number of pixels is Full HD, and is approximately ¹⁄₂₀₀₀ of one frame period when the number of pixels is 4K2K. Thus, it can be said that when the written data potentials are the same, the duty ratios of the generated PWM signals are approximately the same.

Note that a transistor containing a metal oxide in a channel formation region (hereinafter, an OS transistor) is preferably used as the transistor 101 that is an n-channel transistor. In the OS transistor, the semiconductor layer has a large energy gap, and thus the OS transistor can exhibit characteristics with an extremely low off-state current of several yoctoamperes per micrometer (a current value per micrometer of channel width).

The gate potential of the transistor 102 can be retained for a long time by the low off-state current characteristics of the OS transistor. Accordingly, an appropriate PWM signal can be generated even when the frame frequency is lowered. For example, switching between the first frame frequency (e.g., higher than or equal to 60 Hz) in moving image display and the second frame frequency that is lower than the first frame frequency (e.g., approximately 1 to 10 Hz) in still image display can reduce power consumption of the display apparatus.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS, or the like described later can be used, for example. A CAAC-OS has a crystal structure including stable atoms and is suitable for a transistor or the like that puts emphasis on reliability. In addition, a CAC-OS exhibits excellent mobility characteristics and thus is suitable for a transistor or the like that is driven at high speed.

An OS transistor has features such that impact ionization, an avalanche breakdown, a short-channel effect, and the like do not occur, which are different from those of a transistor where silicon is contained in a channel formation region (hereinafter, a Si transistor), and enables formation of a highly reliable circuit. Moreover, variation in electrical characteristics due to crystallinity unevenness, which is caused in Si transistors, is less likely to occur in OS transistors.

A semiconductor layer included in an OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium). The In-M-Zn-based oxide can be typically formed by a sputtering method. Alternatively, the In-M-Zn-based oxide can be formed by an ALD (Atomic layer deposition) method.

It is preferable that the atomic ratio of metal elements in a sputtering target used to form the In-M-Zn-based oxide by a sputtering method satisfy In M and Zn M. The atomic ratio of metal elements of such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements contained in the sputtering target in a range of ±40%.

An oxide semiconductor with low carrier concentration is used for the semiconductor layer. For example, for the semiconductor layer, an oxide semiconductor whose carrier concentration is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has low density of defect states and can be referred to as an oxide semiconductor having stable characteristics.

Note that the composition is not limited to those, and a material having appropriate composition may be used depending on required semiconductor characteristics and electrical characteristics of the transistor (field-effect mobility, threshold voltage, or the like). In addition, to obtain the required semiconductor characteristics of the transistor, it is preferable that the carrier concentration, impurity concentration, defect density, atomic ratio between a metal element and oxygen, interatomic distance, density, and the like of the semiconductor layer be set to be appropriate.

When silicon or carbon, which is one of the Group 14 elements, is contained in the oxide semiconductor that included in the semiconductor layer, oxygen vacancies are increased, and the semiconductor layer becomes n-type. Thus, the concentration (concentration obtained by secondary ion mass spectrometry) of silicon or carbon in the semiconductor layer is set lower than or equal to $2\times10^{18}$ atoms/$cm^3$, preferably lower than or equal to $2\times10^{17}$ atoms/$cm^3$.

In addition, alkali metal and alkaline earth metal might generate carriers when bonded to an oxide semiconductor, in which case the off-state current of the transistor might be increased. Thus, the concentration (concentration obtained by secondary ion mass spectrometry) of alkali metal or alkaline earth metal in the semiconductor layer is set lower than or equal to $1\times10^{18}$ atoms/$cm^3$, preferably lower than or equal to $2\times10^{16}$ atoms/$cm^3$.

Furthermore, when nitrogen is contained in the oxide semiconductor forming the semiconductor layer, electrons serving as carriers are generated and the carrier concentration is increased, so that the semiconductor layer easily becomes n-type. As a result, a transistor using an oxide semiconductor that contains nitrogen is likely to have normally-on characteristics. Therefore, the concentration (concentration obtained by secondary ion mass spectrometry) of nitrogen in the semiconductor layer is preferably set lower than or equal to $5\times10^{18}$ atoms/$cm^3$.

When hydrogen is contained in the oxide semiconductor included in the semiconductor layer, hydrogen reacts with oxygen bonded to a metal atom to be water, and thus sometimes causes an oxygen vacancy in the oxide semiconductor. When the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defect quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" described in this specification and the like can be replaced with "donor concentration" in some cases.

Therefore, hydrogen in the oxide semiconductor is preferably reduced as much as possible. Specifically, the hydrogen concentration in the oxide semiconductor that is obtained by secondary ion mass spectrometry (SIMS) is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The semiconductor layer may have a non-single-crystal structure, for example. The non-single-crystal structure includes, for example, a CAAC-OS (C-Axis Aligned Crystalline Oxide Semiconductor) including a c-axis aligned crystal, a polycrystalline structure, a microcrystalline structure, or an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above-described regions in some cases.

The composition of a CAC (Cloud-Aligned Composite)-OS, which is one embodiment of a non-single-crystal semiconductor layer, is described below.

The CAC-OS is, for example, a composition of a material in which elements that constitute an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that the oxide semiconductor preferably contains at least indium. In particular, indium and zinc are preferably contained. In addition to these, one or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as InO$_{X1}$ (X1 is a real number greater than 0)) or indium zinc oxide (hereinafter referred to as In$_{X2}$Zn$_{Y2}$O$_{Z2}$ (each of X2, Y2, and Z2 is a real number greater than 0)), and gallium oxide (hereinafter referred to as GaO$_{X3}$ (X3 is a real number greater than 0)) or gallium zinc oxide (hereinafter referred to as Ga$_{X4}$Zn$_{Y4}$O$_{Z4}$ (each of X4, Y4, and Z4 is a real number greater than 0)), so that a mosaic pattern is formed, and mosaic-like InO$_{X1}$ or In$_{X2}$Zn$_{Y2}$O$_{Z2}$ is evenly distributed in the film (this composition is hereinafter also referred to as a cloud-like composition).

That is, the CAC-OS is a composite oxide semiconductor having a composition in which a region where GaO$_{X3}$ is a main component and a region where In$_{X2}$Zn$_{Y2}$O$_{Z2}$ or InO$_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1\leq x0\leq 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment.

Meanwhile, the CAC-OS relates to the material composition of an oxide semiconductor. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Thus, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where GaO$_{X3}$ is a main component and the region where In$_{X2}$Zn$_{Y2}$O$_{Z2}$ or InO$_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated intentionally, for example. In the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction measurement that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region (ring region) and a plurality of bright spots in the ring region are observed. Thus, it is found from the electron diffraction pattern that the crystal structure of the CAC-OS includes an nc (nano-crystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions including the respective elements as the main components form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility ($\mu$) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, leakage current can be suppressed and favorable switching operation can be achieved.

Accordingly, when the CAC-OS is used for a semiconductor device, the insulating property derived from $GaO_{X3}$ or the like and the conductivity derived from $In_{X2}Zn_{Y2}O_{Z2}$ or $InO_{X1}$ complement each other, so that high on-state current (Ion) and high field-effect mobility ($\mu$) can be achieved.

A semiconductor device using the CAC-OS has high reliability. Thus, the CAC-OS is suitable for a constituent material of a variety of semiconductor devices.

At least one of the transistor 102 to the transistor 105 may be an OS transistor. Alternatively, at least one of the transistor 102 to the transistor 105 may be a transistor containing silicon in a channel formation region (hereinafter, a Si transistor).

Amorphous silicon, microcrystalline silicon, polycrystalline silicon, single crystal silicon, or the like can be used for the channel formation region of the Si transistor. Note that polycrystalline silicon is preferably used in the case where a transistor is provided on an insulating surface of a glass substrate or the like.

High-quality polycrystalline silicon can be obtained easily by using a laser crystallization step or the like. The high-quality polycrystalline silicon can also be obtained by a solid-phase growth method in which a metal catalyst such as nickel or palladium is added to amorphous silicon and then heated. To enhance crystallinity, the polycrystalline silicon formed by the solid-phase growth method using a metal catalyst may be subjected to laser irradiation. Note that the metal catalyst remains in the polycrystalline silicon and worsens electrical characteristics of the transistor; therefore, it is preferable to provide a region to which phosphorus, a noble gas, or the like is added other than the channel formation region, so that the region captures the metal catalyst.

Note that structures by which the effect of one embodiment of the present invention is obtained are not limited to those described above: Si transistors may be used as all the transistors included in the pixel. One or more of the transistors included in the pixel may be p-channel transistors.

Figure 7:
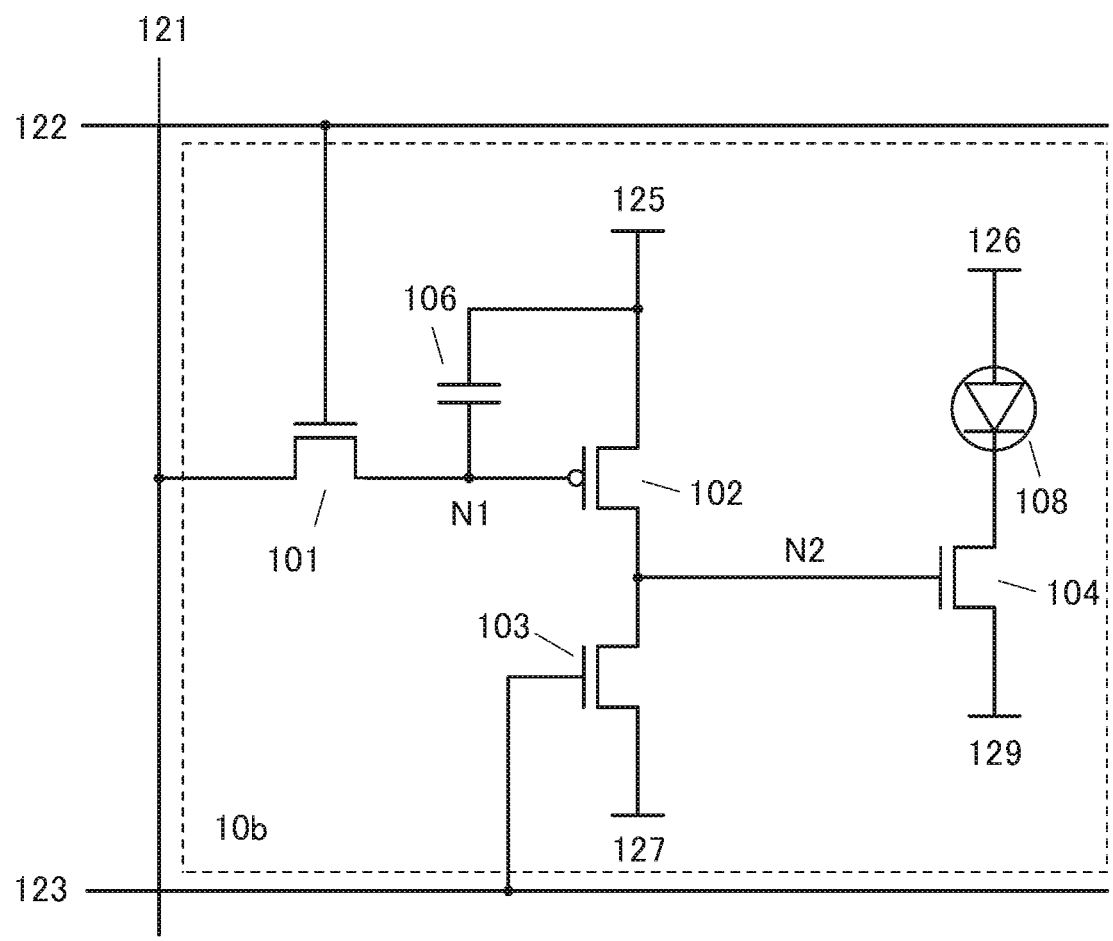
FIG. 7 is a diagram illustrating a pixel circuit.

FIG. 7 is a circuit diagram illustrating a pixel 10b whose configuration is different from that in FIG. 1. The pixel 10b is different from the pixel 10a illustrated in FIG. 1 in that the transistor 102 is a p-channel transistor and the transistor 105 is not provided, and in a connection mode of the capacitor 106.

In the pixel 10b, since the transistor 102 is a p-channel transistor, the source of the transistor 102 is electrically connected to the wiring 125 that supplies a high potential. Thus, the transistor 105 for resetting the source potential (the potential of the node N2) included in the pixel 10a can be omitted. Furthermore, the other electrode of the capacitor 106 retaining Vgs is electrically connected to the wiring 125.

Next, generation of a PWM signal in the pixel 10b is described. The transistor 102 and the transistor 103 are used for generating the PWM signal. Note that the description that is common to the pixel 10a is omitted.

First, the data potential (Vdata) is supplied to the gate of the transistor 102 (the node N1). The signal potential having a ramp wave (Vsweep) is supplied to the gate of the transistor 103.

Vsweep changes over time, and when the absolute value of Vdata-DVDD that is Vgs of the transistor 102 is higher than Vsweep-DVSS that is Vgs of the transistor 103, the potential of the node N2 becomes DVDD. Thus, the transistor 104 is turned on and the light-emitting device 108 is turned on (emits light). In contrast, when the absolute value of Vdata-DVDD is lower than Vsweep-DVSS, the potential of the node N2 becomes DVSS. Accordingly, the transistor 104 is turned off and the light-emitting device 108 is turned off.

Note that the above is an operation of comparing Vgs of the transistor 102 and Vgs of the transistor 103 and is established on the assumption that both of them have equivalent current characteristics.

When the current characteristics of the transistor 102 and those of the transistor 103 are different from each other, the operation can be expressed as an operation of comparing on-state resistances. That is, when the on-state resistance of the transistor 102 is higher than the on-state resistance of the transistor 103, the potential of the node N2 becomes DVDD. In contrast, when the on-state resistance of the transistor 102 is lower than the on-state resistance of the transistor 103, the potential of the node N2 becomes DVSS.

In the above operation, the time during which the potential of the node N2 is DVSS is longer than the time during which it is DVDD when Vdata is relatively low, and the time during which the potential of the node N2 is DVSS is longer than the time during which it is DVDD when Vdata is relatively high. Thus, it can be said that the PWM signals generated with the transistor 102 and the transistor 103 are supplied to the node N2.

Figure 11:
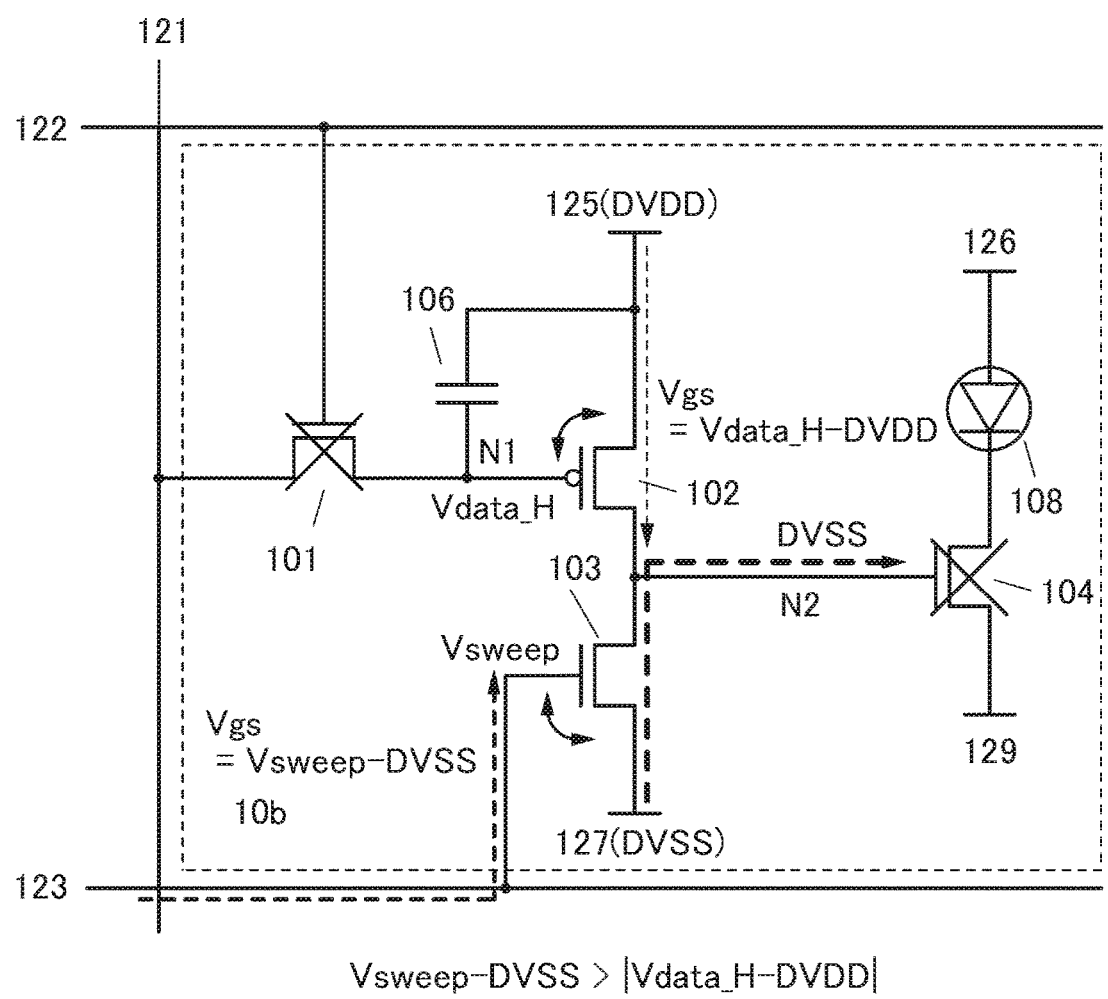
FIG. 11 is a diagram illustrating a pixel operation.
Figure 12:
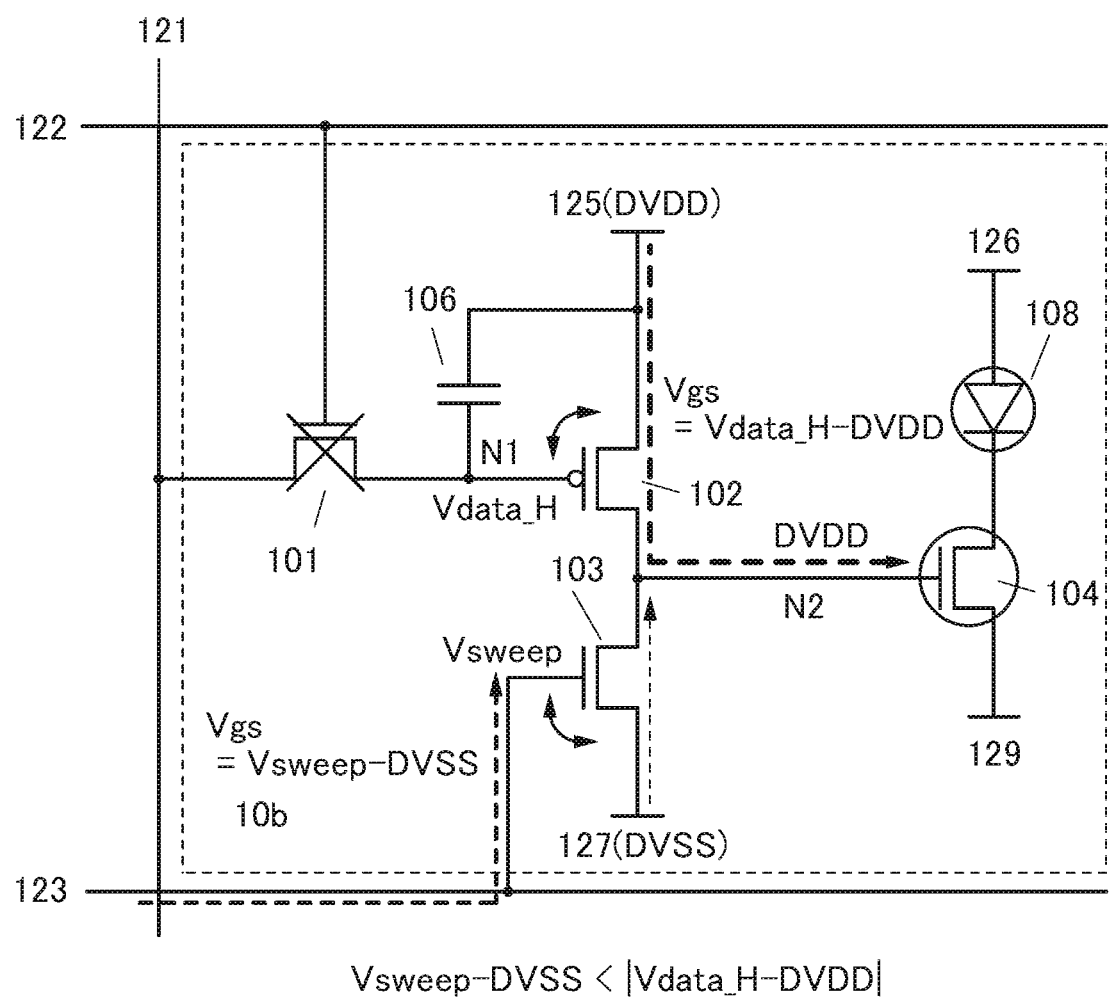
FIG. 12 is a diagram illustrating a pixel operation.

Next, the generation of a PWM signal is described in detail with reference to timing charts shown in FIG. 8 and FIG. 9 and diagrams illustrating circuit operations in FIG. 10, FIG. 11, and FIG. 12. Note that the description that is common to the pixel 10*a* is omitted as appropriate.

Figure 8:
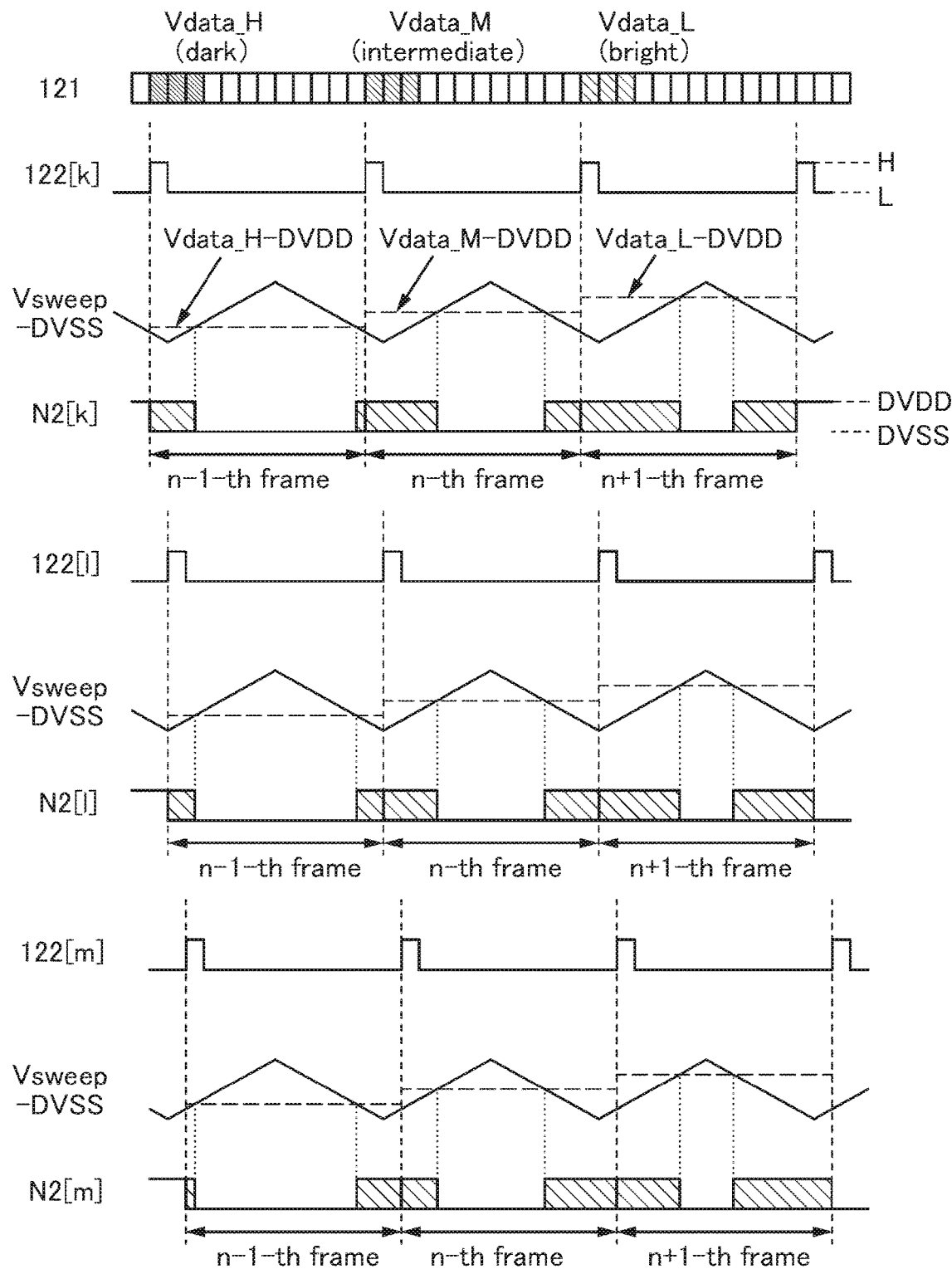
FIG. 8 is a timing chart showing a pixel operation.

FIG. 8 shows the pixels 10*b* arranged in a certain column of three consecutive rows (the k-th row, the l-th row, and the m-th row) as targets. In addition, operations of three consecutive frames (the n−1-th frame to the n+1-th frame; n is an integer greater than or equal to 2) are shown, and PWM signals generated when Vdata_H (dark: low luminance) in the n−1-th frame, Vdata_M (intermediate: intermediate luminance) in the n-th frame, and Vdata_L (blight: high luminance) in the n+1-th frame are written in all the rows are shown.

Vdata_(H, M, or L)-DVDD shown in FIG. 8 corresponds to Vgs of the transistor 102. Vsweep-DVSS corresponds to Vgs of the transistor 103. Vsweep is a signal potential having a ramp wave supplied from the wiring 123.

First, generation of a PWM signal in the pixel 10*b* in the k-th row is described. Note that current characteristics of the transistor 102 and those of the transistor 103 are equivalent to each other.

Figure 10:
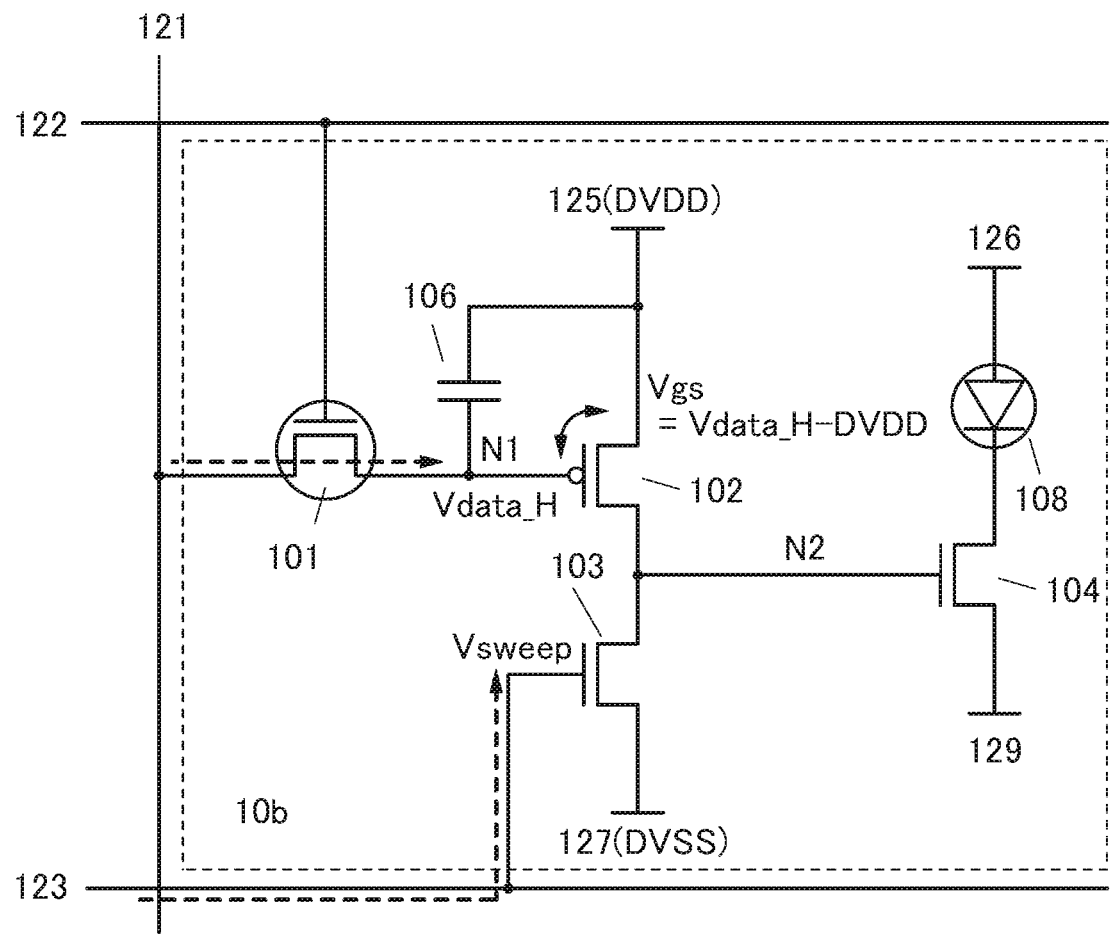
FIG. 10 is a diagram illustrating a pixel operation.

In the n−1-th frame, the potential of the wiring 122[*k*] becomes H (high potential), the transistor 101 is turned on, and Vdata_H is supplied to the node N1 (see FIG. 10). At this time, Vgs of the transistor 102 becomes Vdata_H-DVDD.

Figure 9A:
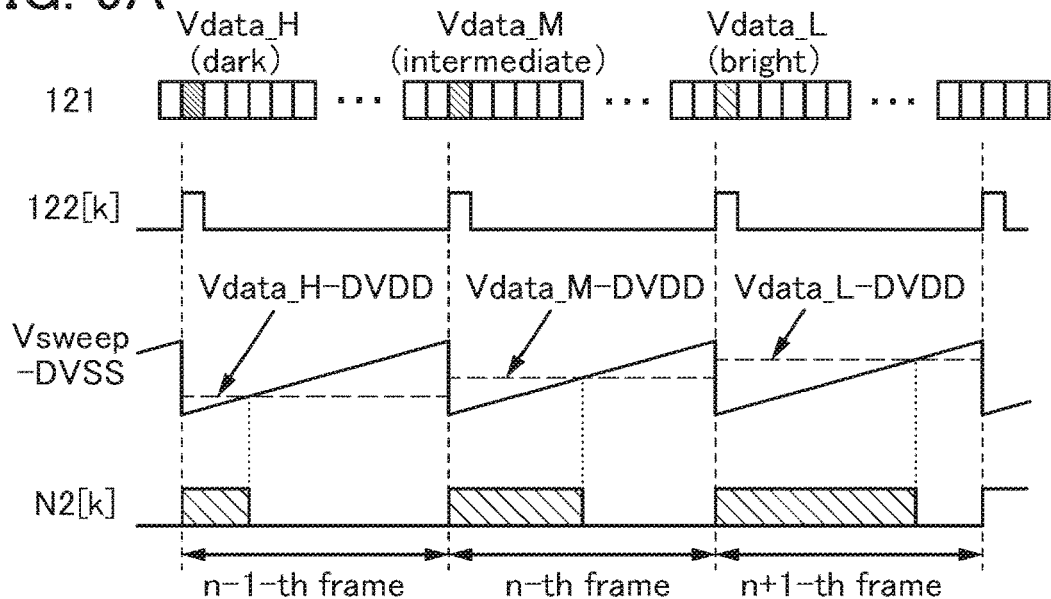
FIG. 9A to FIG. 9C are timing charts each showing a pixel operation.

In parallel with the above operation, a ramp wave is supplied to the wiring 123 (see FIG. 10). For example, the ramp wave can be a triangle wave as shown by Vsweep-DVSS in FIG. 8. Alternatively, the ramp wave can be a sawtooth wave as shown in FIG. 9A. A sine wave, a trapezoidal waveform, or the like can also be used.

Figure 9B:
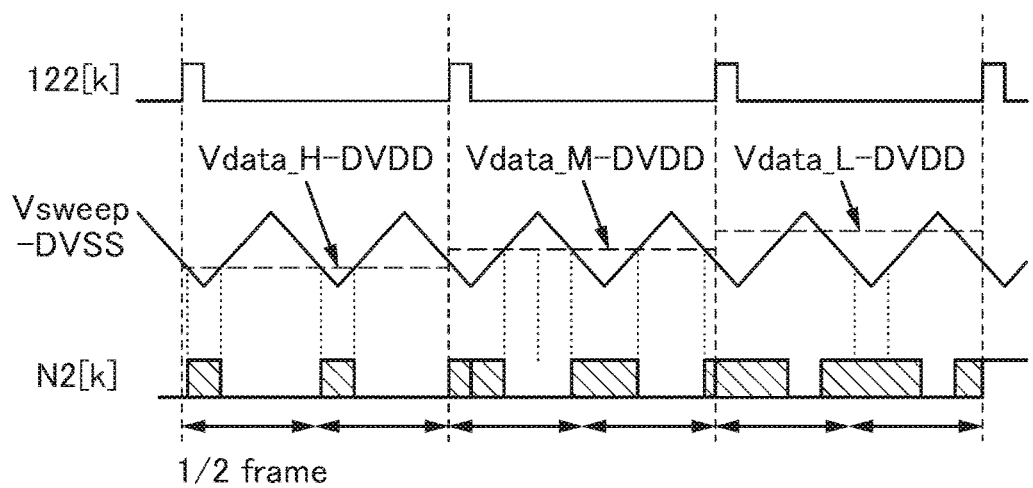
Figure 9C:
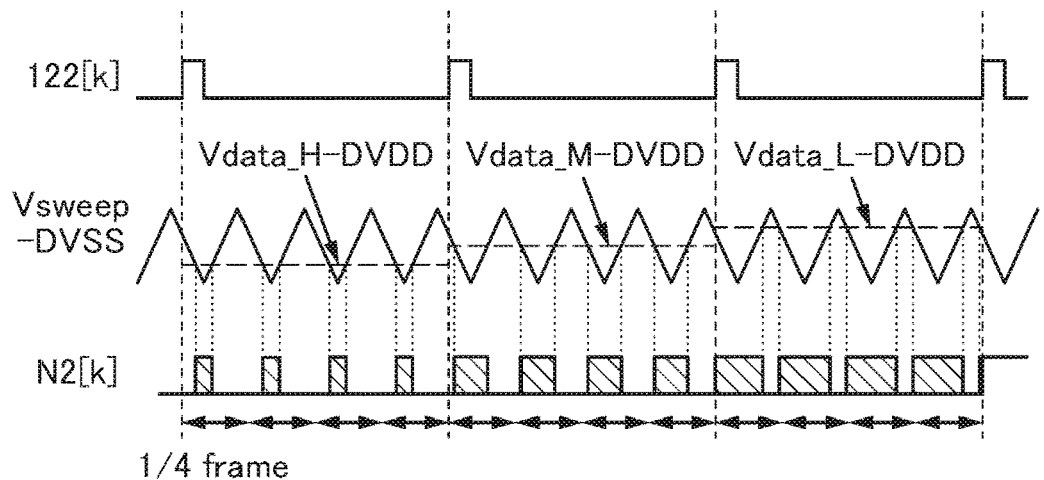

The cycle of the ramp wave can be one frame period at the longest as shown in FIG. 8. As shown in FIG. 9B and FIG. 9C, the ramp waveform cycle may be a half-frame period or a quarter-frame period. Moreover, the ramp waveform cycle may be further shortened.

In one frame period, Vdata_H-DVDD is constant; however, Vsweep-DVSS changes over time. Accordingly, the period in which DVSS is supplied to the node N2 when Vsweep-DVSS>|Vdata_H-DVDD| (see FIG. 11) and the period in which DVDD is supplied to the node N2 when Vsweep-DVSS<|Vdata_H-DVDD| (see FIG. 12) are generated.

In FIG. 8, since Vdata_H is written in the n−1-th frame, the period in which DVSS is supplied to the node N2 is long and the period in which DVDD is supplied to the node N2 is short. That is, the duty ratio is increased and the average current in one frame period is decreased, so that display with low luminance can be performed.

In the n-th frame, Vdata_M is written and Vgs of the transistor 102 becomes Vdata_M-DVDD. As in the description of the n−1-th frame, an operation of comparing Vdata_M-DVDD and Vsweep-DVSS is performed, and the duty ratio is larger than that in the n−1-th frame.

In the n+1-th frame, Vdata_L is written and Vgs of the transistor 102 becomes Vdata_L-DVDD. As in the description of the n−1-th frame, an operation of comparing Vdata_L-DVDD and Vsweep-DVSS is performed, the duty ratio is larger than that in the n-th frame, and the average current in one frame period is increased, so that display with high luminance can be performed.

Next, generation of a PWM signal in the pixel 10*b* in the l-th row is described. In the l-th row, a data potential is written with a delay by one horizontal period behind the k-th row, and the frame period is started. Meanwhile, since the ramp waves are supplied to the wirings 123 with waveforms having the same phase in all the pixels, the timing at which Vsweep-DVSS>|Vdata_(H, M, or L)-DVDD| is satisfied and the timing at which Vsweep-DVSS<|Vdata_(H, M, or L)-DVDD| is satisfied are different even in the case where the same data potential as in the k-th row is written. Note that when the written data potentials are the same, the duty ratios of the generated PWM signals are the same.

The same applies to the m-th row; the timing at which Vsweep-DVSS>|Vdata_(H, M, or L)-DVDD| is satisfied and the timing at which Vsweep-DVSS<|Vdata_(H, M, or L)-DVDD| is satisfied are different even in the case where the same data potential as in the l-th row is written. Note that when the written data potentials are the same, the duty ratios of the generated PWM signals are the same.

Note that in the pixel 10*b* illustrated in FIG. 7, an operation of resetting the node N2 is not performed, whereby a light-emitting operation is performed when Vsweep-DVSS<|Vdata_(H, M, or L)-DVDD| is satisfied at the time of writing data.

Note that a transistor containing a metal oxide in a channel formation region (hereinafter, an OS transistor) is preferably used as the transistor 101 that is an n-channel transistor as in the pixel 10*a*.

The transistor 102 is preferably a Si transistor, which has favorable electrical characteristics even when it is a p-channel transistor.

Note that structures by which the effect of one embodiment of the present invention is obtained are not limited to those described above: Si transistors may be used as all the transistors included in the pixel. One or more of the transistors included in the pixel other than the transistor 102 may be p-channel transistors. The transistors included in the pixel other than the transistor 102 may be OS transistors.

Figure 13A:
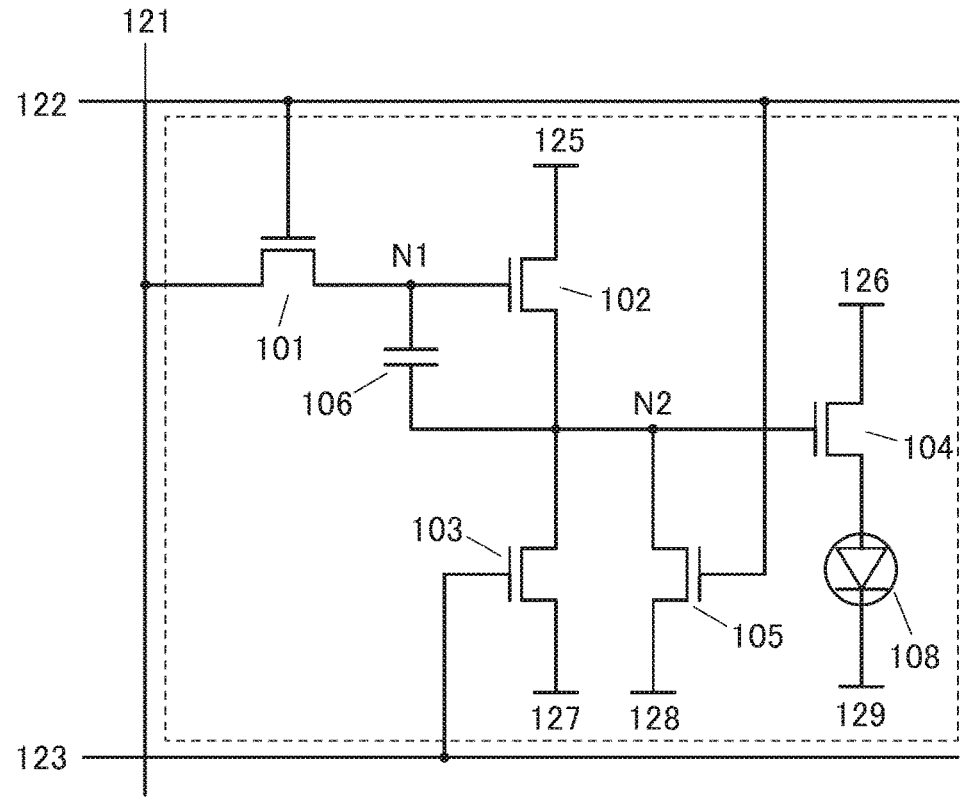
FIG. 13A and FIG. 13B are diagrams each illustrating a pixel circuit.
Figure 13B:
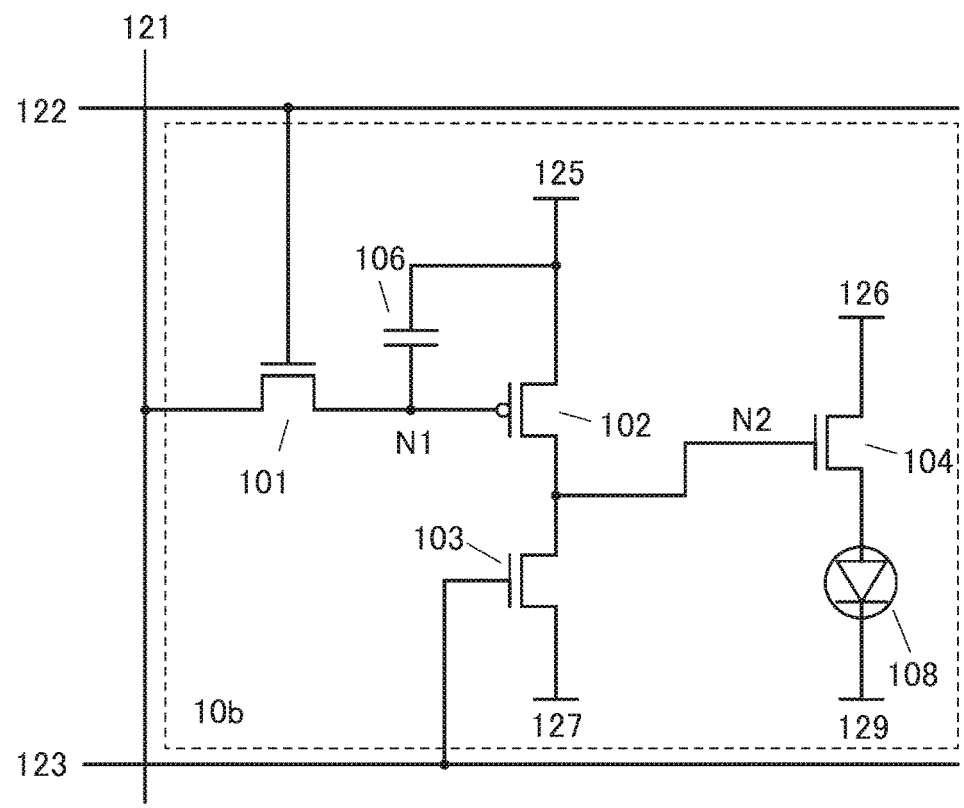

The light-emitting device 108 can be an LED but may be an organic EL element. Note that in the case where an organic EL element is used, the wiring 126 may be electrically connected to one of the source and the drain of the transistor 104, and the cathode of the light-emitting device 108 may be connected to the other of the source and the drain of the transistor 104 as illustrated in FIG. 13A and FIG. 13B. Even in the case where an LED is used as the light-emitting device 108, configurations illustrated in FIG. 13A and FIG. 13B can also be used.

Figure 14A:
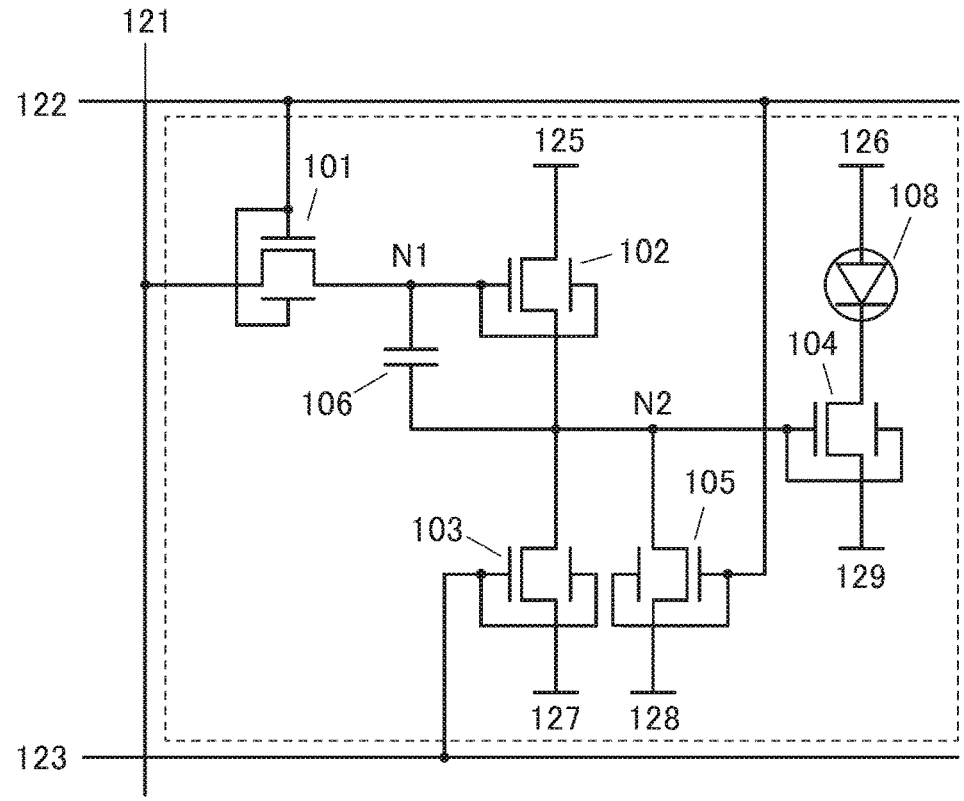
FIG. 14A and FIG. 14B are diagrams each illustrating a pixel circuit.
Figure 14B:
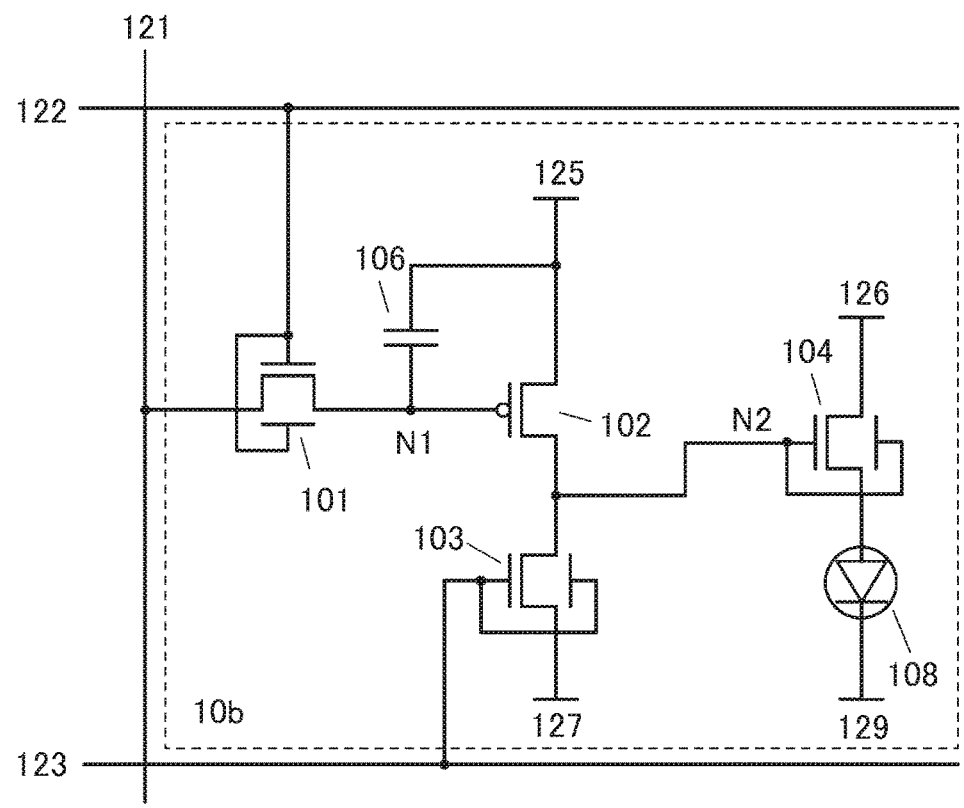

Note that in the case where OS transistors are used as the n-channel transistors, a configuration with a back gate as illustrated in FIG. 14A or FIG. 14B may be employed. Supplying the same potential to the back gate and a front gate can increase on-state current. Alternatively, a configuration may be employed in which the back gates can be supplied with a constant potential. Supplying a constant potential to the back gate can control the threshold voltage.

Figure 15:
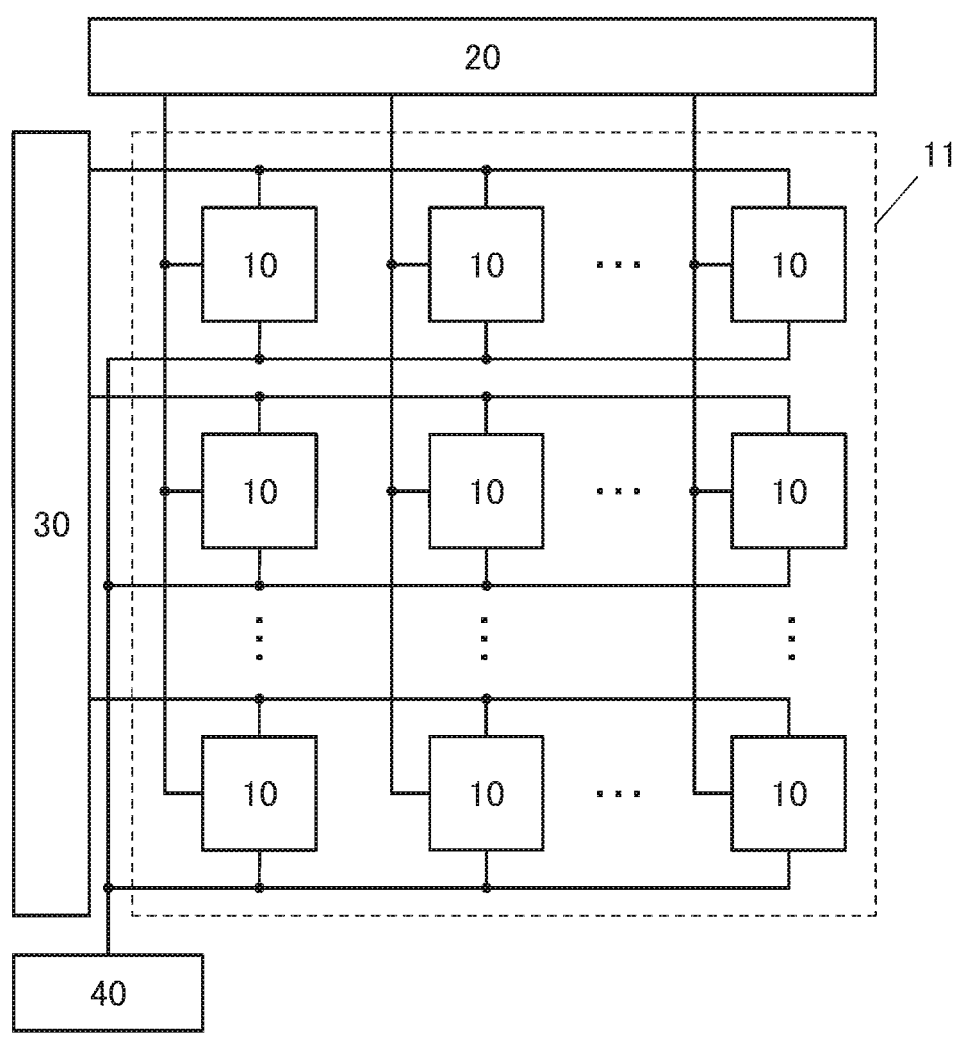
FIG. 15 is a block diagram illustrating a display apparatus.

FIG. 15 is a block diagram illustrating a display apparatus according to one embodiment of the present invention. The display apparatus includes a pixel array 11, a source driver 20, and a gate driver 30. The pixel array 11 includes pixels 10 arranged in a column direction and a row direction. The pixel 10*a* or the pixel 10*b* described in this embodiment can be used as each of the pixels 10. Note that wirings are illustrated in a simplified way in the drawing, and the wirings connected to the components of the pixel 10 according to one embodiment of the present invention are provided.

A sequential circuit such as a shift register can be used for the source driver 20 and the gate driver 30.

A ramp wave signal generation circuit 40 that generates a triangle wave, a sawtooth wave, or the like is provided and is electrically connected to the pixels 10.

Note that for the source driver 20, the gate driver 30, and the ramp wave signal generation circuit 40, a method in which an IC chip is attached externally by a COF (chip on film) method, a COG (chip on glass) method, a TCP (tape carrier package) method, or the like can be used. Alternatively, the source driver 20, the gate driver 30, and the ramp wave signal generation circuit may be formed over the same substrate as the pixel array 11 by using transistors manufactured using steps common to those of the pixel array 11.

Although an example in which the gate driver 30 is placed on one side of the pixel array 11 is illustrated, two gate drivers 30 may be placed with the pixel array 11 therebetween to divide driving rows.

Figure 16:
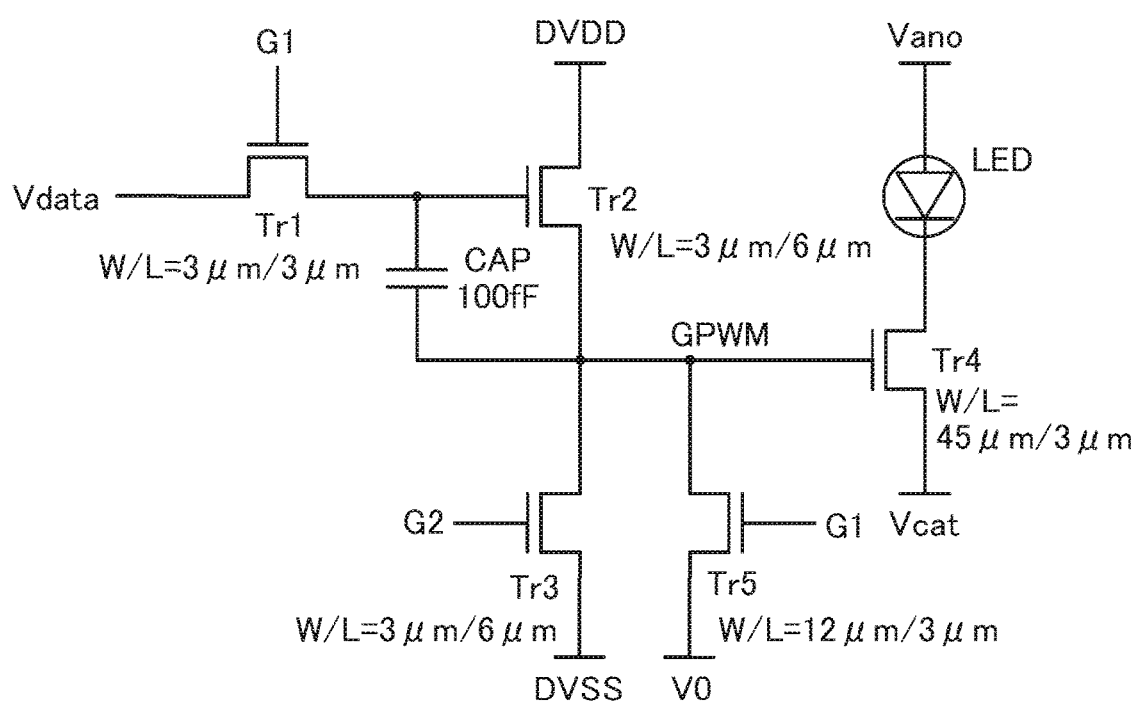
FIG. 16 is a diagram illustrating a pixel used for simulation.

Next, simulation results of pixel operations are described. FIG. 16 illustrates a configuration of a pixel PIX used in the simulation. The pixel PIX is the same as the pixel circuit illustrated in FIG. 1, and a transistor Tr1 to a transistor Tr5 are n-channel OS transistors. A node corresponding to the node N2 in FIG. 1 is referred to as GPWM. A wiring corresponding to the wiring 122 in FIG. 1 is referred to as G1, and a wiring corresponding to the wiring 123 is referred to as G2.

Each parameter used in the simulation is as follows. For transistor size, W/L=3 μm/3 μm (the transistor Tr1), W/L=3 μm/6 μm (the transistor Tr2 and the transistor Tr3), W/L=45 μm/3 μm (the transistor Tr4: a driving transistor), and W/L=12 μm/3 μm (the transistor Tr5) are used. The capacitance value of a capacitor CAP is 100 fF. "H" voltage and "L" voltage applied to a gate of the transistor (including a ramp wave) are +15 V and −5 V, respectively. An anode potential (Vano) is +20 V, a cathode potential (Vcat) is 0 V, voltage V0 is −2 V, voltage DVDD is +12 V, voltage DVSS is −2 V, and Vdata is +2 V to +10 V. Note that SPICE is used as circuit simulation software.

Figure 17A:
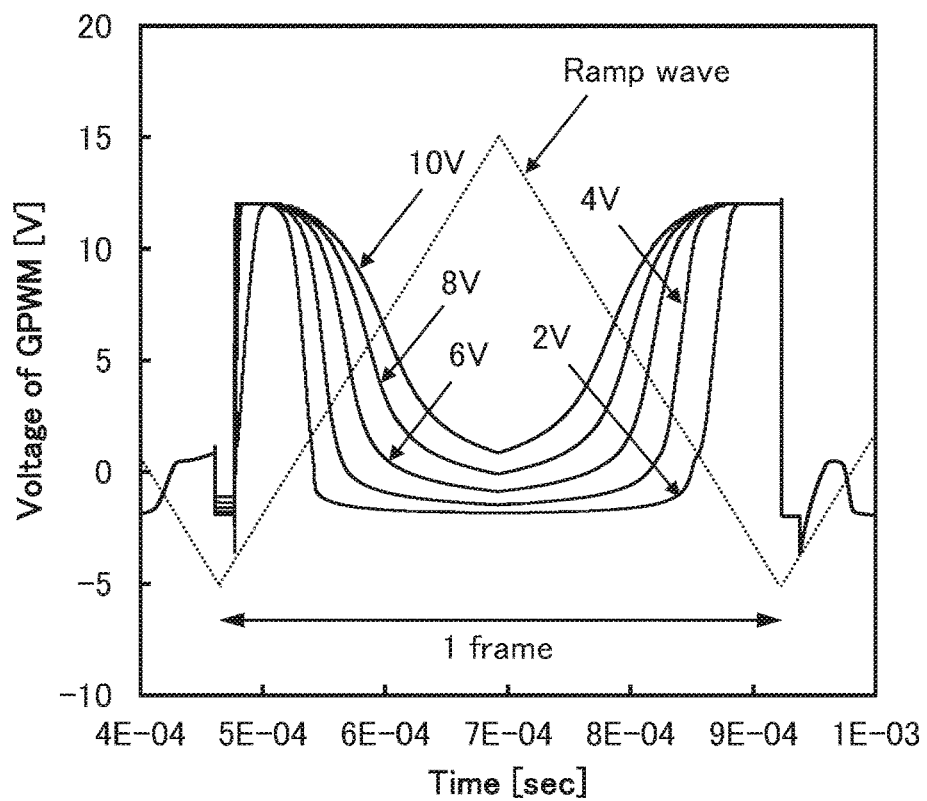
FIG. 17A and FIG. 17B are diagrams showing simulation results.

FIG. 17A shows simulation results of the voltage of the node N2 when Vdata is +2 V to +10 V (in 2 V steps) in one frame. The horizontal axis represents time (sec), and the case where a ramp wave (a triangle wave) has the maximum value at the center of one frame period is assumed.

Figure 17B:
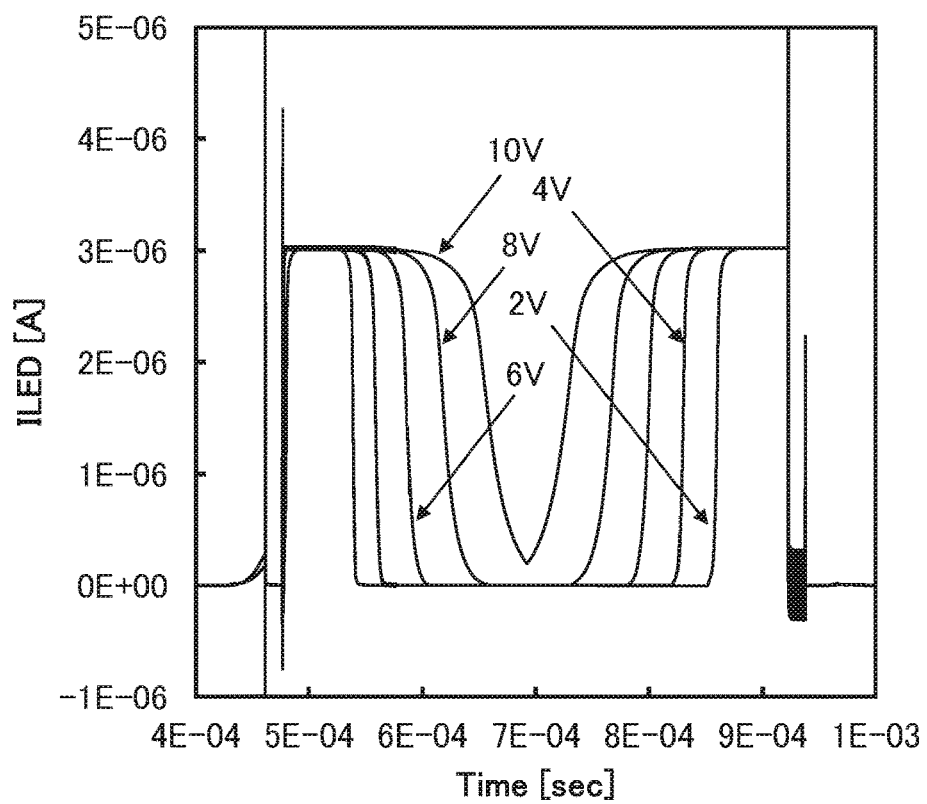
Figure 18A:
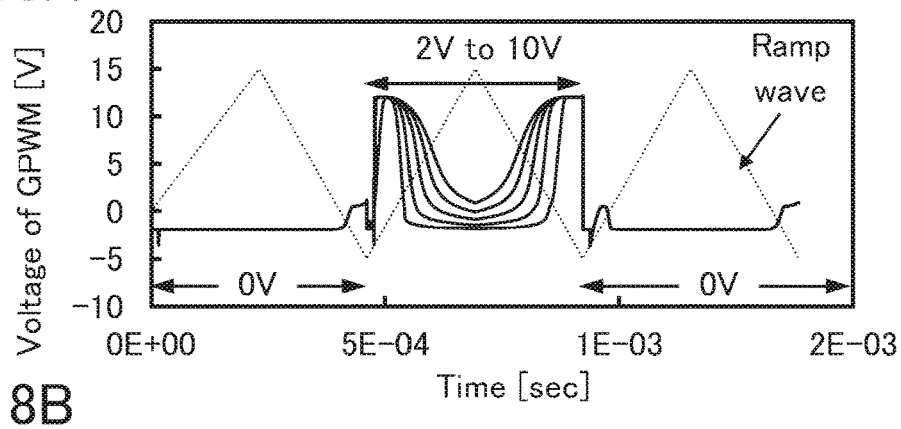
FIG. 18A to FIG. 18D are diagrams showing simulation results.
Figure 18B:
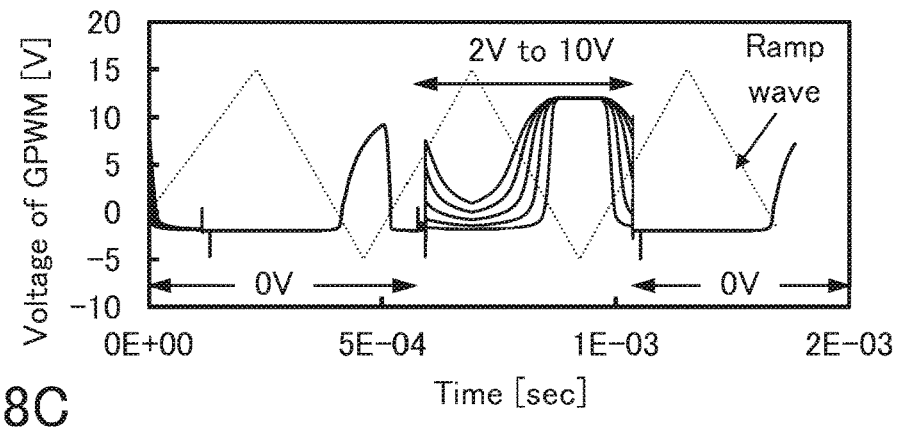
Figure 18C:
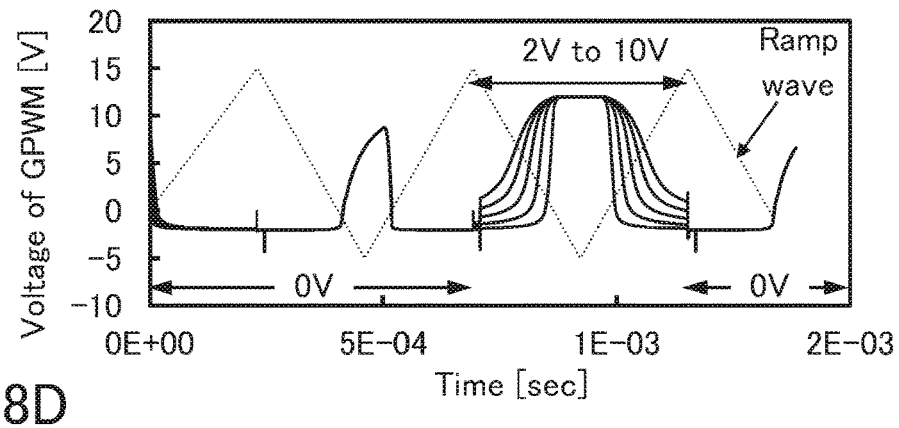
Figure 18D:
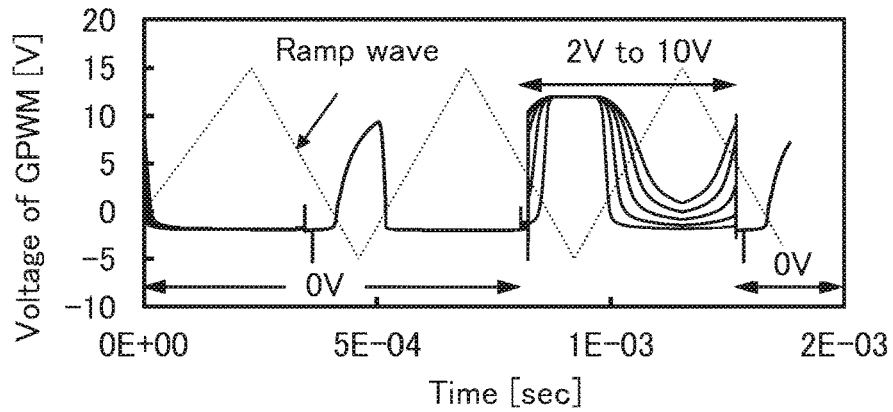

The results show that the waveform of a PWM signal output to the node GPWM is a waveform having a pulse width corresponding to the value of Vdata. FIG. 17B shows simulation results of current (ILED) flowing to an LED in accordance with each of the PWM signals shown in FIG. 17A. It is confirmed that current flows in accordance with the generated PWM signal.

FIG. 18A to FIG. 18D show simulation results of the waveforms of the PWM signals of the rows corresponding to the k-th row to the m-th row shown in FIG. 2. The value of Vdata is +2 V to +10 V (in 2 V steps) in one frame period and is 0 V before and after the frame period. In each of the k-th row to the m-th row, the phases of ramp waves to be supplied are the same but the timings at which Vdata is written are different. The results show that the phases of the PWM signals in rows are different from each other but the duty ratio depends on the value of Vdata.

From the above simulation results, the effect of one embodiment of the present invention can be confirmed.

This embodiment can be implemented in an appropriate combination with the structures described in the other embodiments.

Embodiment 2

In this embodiment, a structure example of a display apparatus using a light-emitting device is described. Note that the description of the components, operations, and functions of the display apparatus described in Embodiment 1 is omitted in this embodiment.

The pixel 10 (the pixel 10a or the pixel 10b) described in Embodiment 1 can be used for the display apparatus described in this embodiment. Note that a scan line driver circuit and a signal line driver circuit to be described below correspond to the gate driver and the source driver, respectively.

Figure 19A:
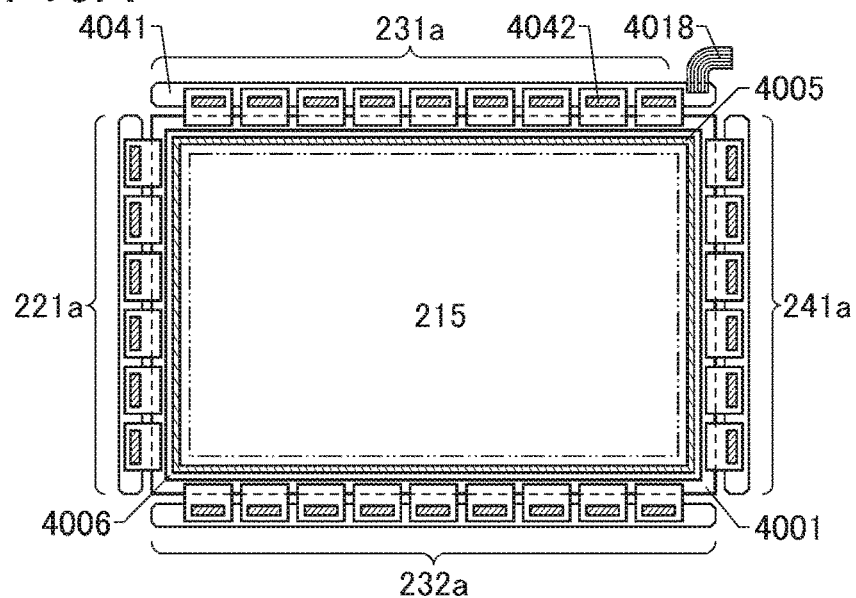
FIG. 19A to FIG. 19C are diagrams each illustrating a display apparatus.
Figure 19B:
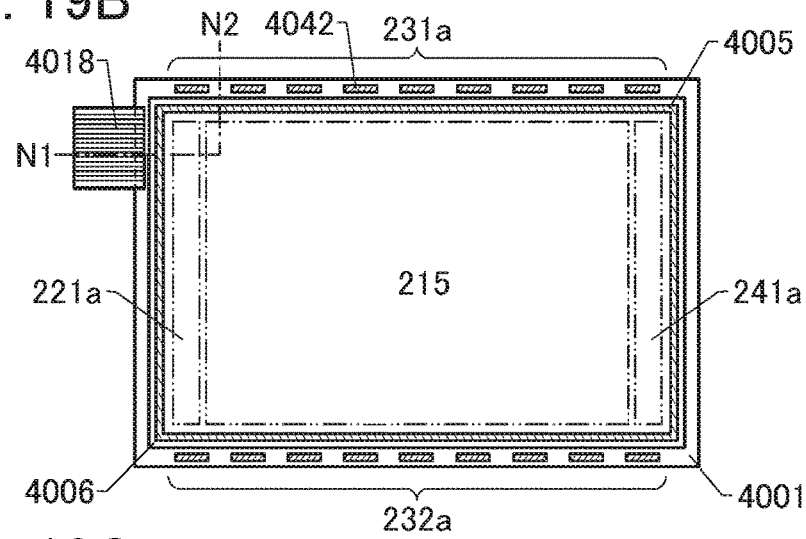
Figure 19C:
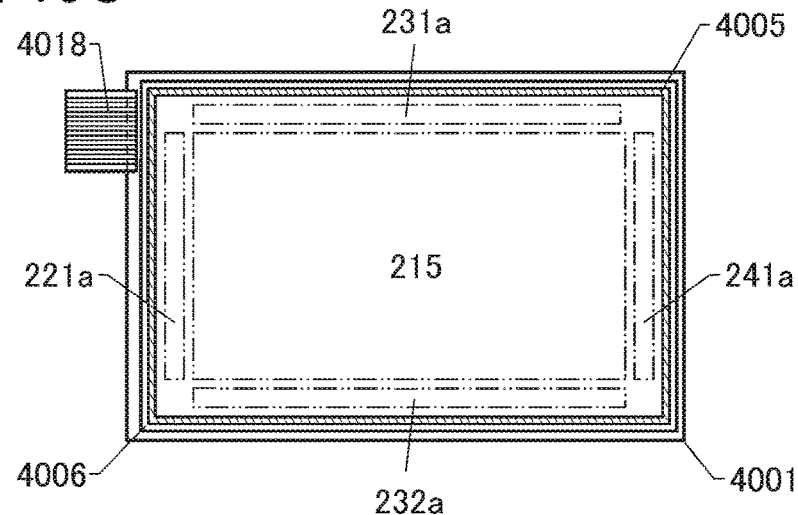

FIG. 19A to FIG. 19C are diagrams each illustrating a structure of a display apparatus in which one embodiment of the present invention can be used.

In FIG. 19A, a sealant 4005 is provided to surround a display portion 215 provided over a first substrate 4001, and the display portion 215 is sealed with the sealant 4005 and a second substrate 4006.

In FIG. 19A, a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The common line driver circuit 241a has a function of supplying a prescribed potential to the wirings 122, 127, 128, 129, and the like described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COF method, a COG method, a TCP method, or the like can be used.

FIG. 19B illustrates an example in which the integrated circuits 4042 included in the signal line driver circuit 231a and the signal line driver circuit 232a are mounted by a COG method. Some or all of the driver circuits can be formed over the same substrate as the display portion 215, so that a system-on-panel can be formed.

In the example illustrated in FIG. 19B, the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 19B, the sealant 4005 is provided to surround the display portion 215, the scan line driver circuit 221a, and the common line driver circuit 241a that are provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with the display device by the use of the first substrate 4001, the sealant 4005, and the second substrate 4006.

Although the signal line driver circuit 231a and the signal line driver circuit 232a are separately formed and mounted on the first substrate 4001 in the example illustrated in FIG. 19B, one embodiment of the present invention is not limited to this structure. The scan line driver circuit may be separately formed and then mounted, or part of the signal line driver circuit or part of the scan line driver circuit may be separately formed and then mounted. The signal line driver circuit 231a and the signal line driver circuit 232a may be formed over the same substrate as the display portion 215, as illustrated in FIG. 19C.

In some cases, the display apparatus includes a panel in which a display device is sealed, and a module in which an IC or the like including a controller is mounted on the panel.

The display portion and the scan line driver circuit provided over the first substrate each include a plurality of transistors. The Si transistor or the OS transistor described in Embodiment 1 can be applied to each of the transistors.

Transistors included in peripheral driver circuits and transistors included in the pixel circuits of the display portion may have either the same structure or different structures. The transistors included in the peripheral driver circuits may be transistors having the same structure, or transistors having two or more kinds of structures may be included. Similarly, the transistors included in the pixel circuits may be transistors having the same structure, or transistors having two or more kinds of structures may be included.

In addition, an input device 4200 to be described later (see FIG. 20B) can be provided over the second substrate 4006 as an example. A structure where the display apparatus illustrated in FIG. 19A to FIG. 19C is provided with the input device 4200 can function as a touch panel.

There is no limitation on a sensor device (also referred to as a sensor element) included in a touch panel according to one embodiment of the present invention. A variety of sensors capable of sensing approach or contact of a sensing target such as a finger or a stylus can be applied to the sensor device.

For example, a variety of types such as a capacitive type, a resistive type, a surface acoustic wave type, an infrared type, an optical type, and a pressure-sensitive type can be used as the sensor type.

In this embodiment, a touch panel including a capacitive sensor device is described as an example.

Examples of the capacitive type include a surface capacitive type and a projected capacitive type. Examples of the projected capacitive type include a self-capacitive type and a mutual capacitive type. The use of a mutual capacitive type is preferred because multiple points can be sensed simultaneously.

The touch panel according to one embodiment of the present invention can employ a variety of structures, including a structure in which a display apparatus and a sensor device that are separately formed are attached to each other and a structure in which an electrode and the like included in a sensor device are provided on one or both of a substrate supporting a display device and a counter substrate.

Figure 20A:
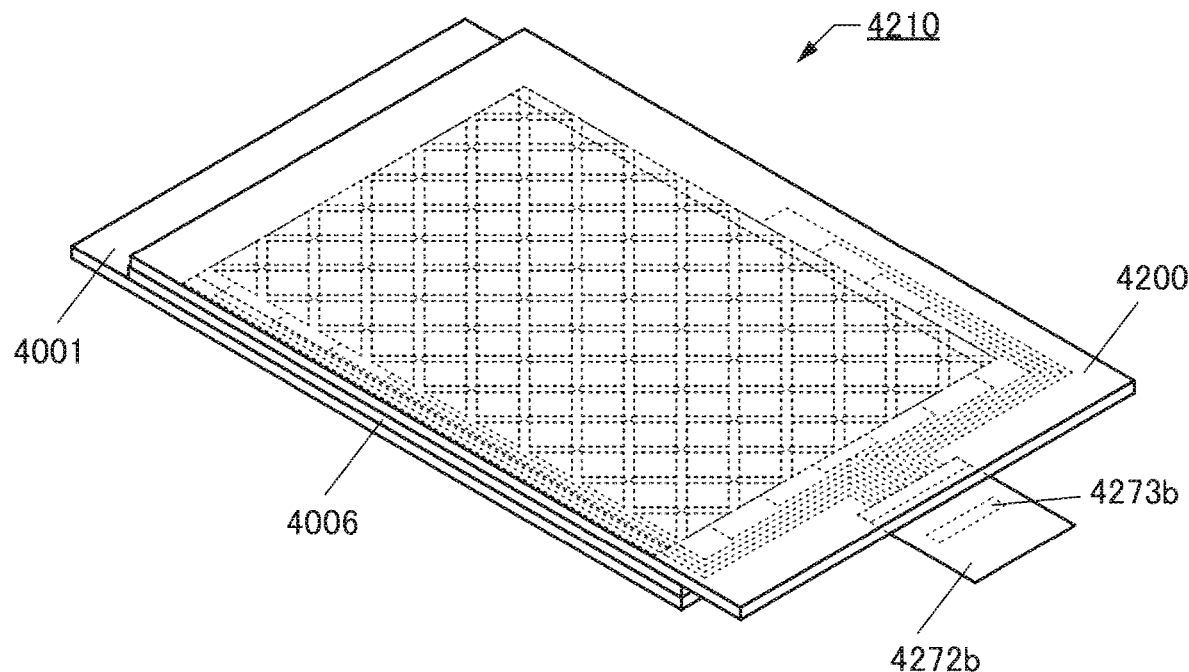
FIG. 20A and FIG. 20B are diagrams illustrating a touch panel.
Figure 20B:
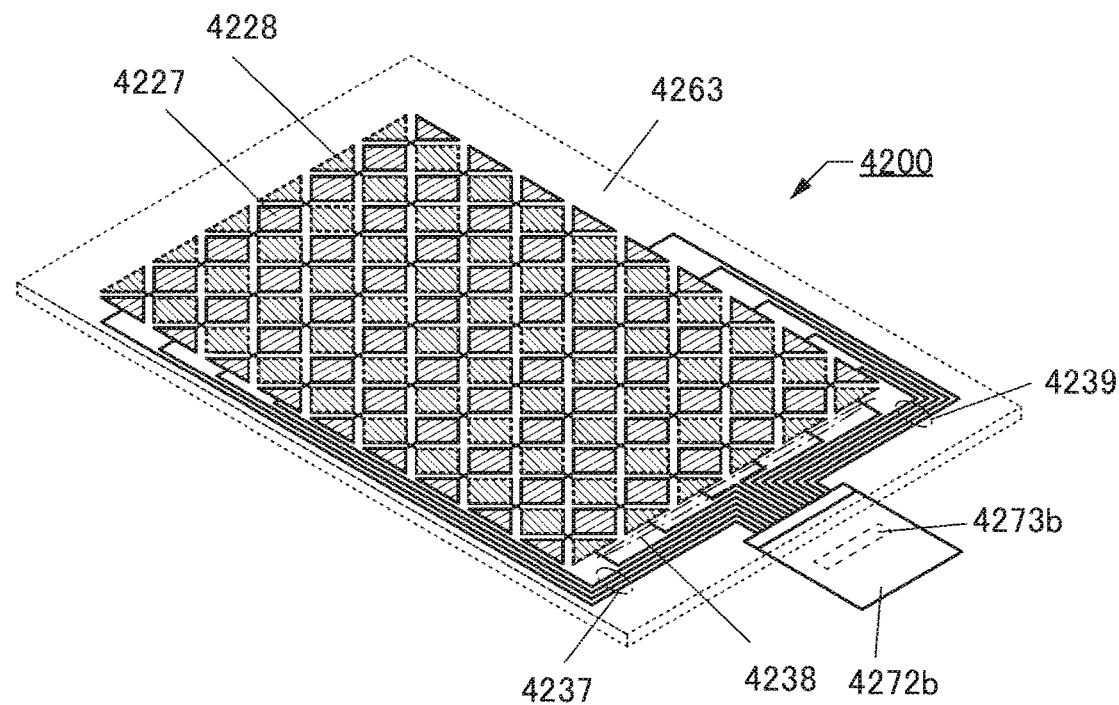

FIG. 20A and FIG. 20B illustrate an example of the touch panel. FIG. 20A is a perspective view of a touch panel 4210. FIG. 20B is a schematic perspective view of the input device 4200. Note that for clarity, only typical components are illustrated.

The touch panel 4210 has a structure in which a display apparatus and a sensor device that are separately formed are attached to each other.

The touch panel 4210 includes the input device 4200 and the display apparatus, which are provided to overlap with each other.

The input device 4200 includes a substrate 4263, an electrode 4227, an electrode 4228, a plurality of wirings 4237, a plurality of wirings 4238, and a plurality of wirings 4239. The electrode 4227 can be electrically connected to the wiring 4237 or the wiring 4239, for example. In addition, the electrode 4228 can be electrically connected to the wiring 4239. An FPC 4272b is electrically connected to each of the plurality of wirings 4237 and the plurality of wirings 4238. An IC 4273b can be provided for the FPC 4272b.

Alternatively, a touch sensor may be provided between the first substrate 4001 and the second substrate 4006 in the display apparatus. In the case where a touch sensor is provided between the first substrate 4001 and the second substrate 4006, either a capacitive touch sensor or an optical touch sensor including a photoelectric conversion element may be employed.

Figure 21:
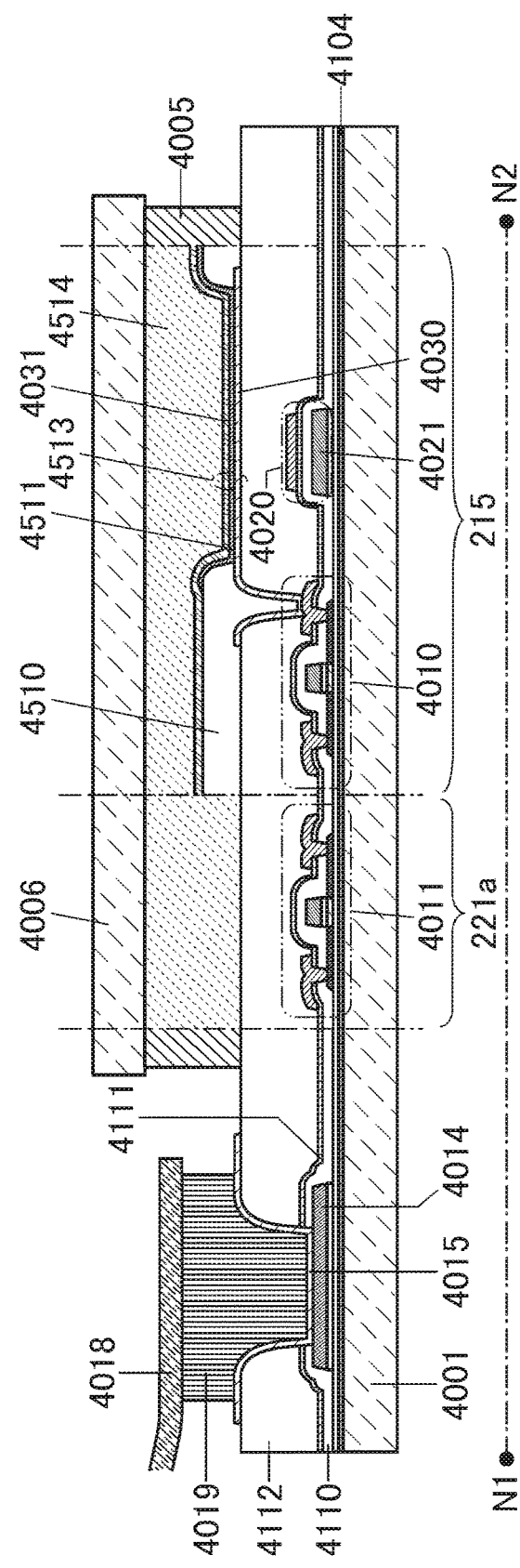
FIG. 21 is a diagram illustrating a display apparatus.

FIG. 21 is a cross-sectional view of a portion indicated by chain line N1-N2 in FIG. 20B. FIG. 21 illustrates an example of a display apparatus in which an organic EL device that is a light-emitting device is used as a display device. The display apparatus includes an electrode 4015, and the electrode 4015 is electrically connected to a terminal included in the FPC 4018 through an anisotropic conductive layer 4019. In FIG. 21, the electrode 4015 is electrically connected to a wiring 4014 in an opening formed in an insulating layer 4112, an insulating layer 4111, and an insulating layer 4110.

The electrode 4015 is formed using the same conductive layer as a first electrode layer 4030, and the wiring 4014 is formed using the same conductive layer as gate electrodes of a transistor 4010 and a transistor 4011.

The display portion 215 and the scan line driver circuit 221a provided over the first substrate 4001 each include a plurality of transistors, and the transistor 4010 included in the display portion 215 and the transistor 4011 included in the scan line driver circuit 221a are illustrated as an example. Note that in the example illustrated in FIG. 21, the transistor 4010 and the transistor 4011 are top-gate transistors but may be bottom-gate transistors.

The insulating layer 4112 is provided over the transistor 4010 and the transistor 4011. A partition 4510 is formed over the insulating layer 4112.

The partition 4510 is formed using an organic insulating material or an inorganic insulating material. It is particularly preferable that the partition 4510 be formed using a photosensitive resin material to have an opening portion over the first electrode layer 4030 such that a side surface of the opening portion is formed to be an inclined surface with continuous curvature.

The display apparatus further includes a capacitor 4020. An example is illustrated in which the capacitor 4020 includes an electrode 4021 formed in the same step as the gate electrode of the transistor 4010, the insulating layer 4110, the insulating layer 4111, and an electrode formed in the same step as a source electrode and a drain electrode. The capacitor 4020 is not limited to having this structure and may be formed using another conductive layer and another insulating layer.

The display apparatus further includes the insulating layer 4111 and an insulating layer 4104. For the insulating layer 4111 and the insulating layer 4104, insulating layers through which an impurity element does not easily pass are used. A semiconductor layer of the transistor is sandwiched between the insulating layer 4111 and the insulating layer 4104, so that entry of impurities from the outside can be prevented.

The transistor 4010 provided in the display portion 215 is electrically connected to the display device. As the display device, a light-emitting device can be used. As the light-emitting device, for example, an EL device that utilizes electroluminescence can be employed. An EL device includes a layer containing a light-emitting compound (also referred to as an "EL layer") between a pair of electrodes. By generating a potential difference between the pair of electrodes that is greater than the threshold voltage of the EL device, holes are injected to the EL layer from the anode side and electrons are injected to the EL layer from the cathode side. The injected electrons and holes are recombined in the EL layer and a light-emitting compound contained in the EL layer emits light.

As the EL device, an organic EL device (also referred to as an organic EL element) or an inorganic EL device (also referred to as an inorganic EL element) can be used, for example.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL devices are classified according to their element structures into a dispersion-type inorganic EL device and a thin-film inorganic EL device. A dispersion-type inorganic EL device includes a light-emitting layer where particles of a light-emitting material are dispersed in a binder, and its light emission mechanism is donor-acceptor recombination type light emission that utilizes a donor level and an acceptor level. A thin-film inorganic EL device has a structure where a light-emitting layer is sandwiched between dielectric layers, which are further sandwiched between electrodes, and its light emission mechanism is localization type light emission that utilizes inner-shell electron transition of metal ions. Note that the description is made here using an organic EL device as the light-emitting device.

In order to extract light emitted from the light-emitting device, at least one of the pair of electrodes needs to be transparent. A transistor and a light-emitting device are formed over a substrate. The light-emitting device can have a top-emission structure in which light emission is extracted from a surface on a side opposite to the substrate; a bottom emission structure in which light emission is extracted from a surface on a substrate side; or a dual emission structure in which light emission is extracted from both surfaces.

A black matrix (a light-blocking layer); a coloring layer (a color filter); an optical member (an optical substrate) such as a polarizing member, a retardation member, or an anti-reflection member; or the like may be provided as appropriate if needed.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can also be used for the light-blocking layer. For example, a stacked-layer structure of a film containing a material of a coloring layer that transmits light of a certain color and a film containing a material of a coloring layer that transmits light of another color can be used. Material sharing between the coloring layer and the light-blocking layer is preferable because process simplification as well as equipment sharing can be achieved.

Examples of a material that can be used for the coloring layer include a metal material, a resin material, and a resin material containing a pigment or a dye. The light-blocking layer and the coloring layer can be formed by, for example, an inkjet method or the like.

A light-emitting device 4513 serving as the display device is electrically connected to the transistor 4010 provided in the display portion 215. Note that the structure of the light-emitting device 4513 is a stacked-layer structure of the first electrode layer 4030, a light-emitting layer 4511, and a second electrode layer 4031; however, this embodiment is not limited to this structure. The structure of the light-emitting device 4513 can be changed as appropriate depending on a direction in which light is extracted from the light-emitting device 4513, or the like.

The light-emitting layer 4511 may be formed using a single layer or a plurality of layers stacked.

The emission color of the light-emitting device 4513 can be white, red, green, blue, cyan, magenta, yellow, or the like depending on the material for the light-emitting layer 4511.

As a method for achieving color display, there are a method in which the light-emitting device 4513 that emits white light is combined with a coloring layer and a method in which the light-emitting device 4513 that emits light of a different emission color is provided in each pixel. The former method is more productive than the latter method. In contrast, the latter method, which requires separate formation of the light-emitting layer 4511 pixel by pixel, is less productive than the former method. However, the latter method can provide higher color purity of the emission color than the former method. In the latter method, the color purity can be further increased when the light-emitting device 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition 4510 in order to prevent entry of oxygen, hydrogen, moisture, carbon dioxide, or the like into the light-emitting device 4513. For the protective layer, silicon nitride, silicon nitride oxide, aluminum oxide, aluminum nitride, aluminum oxynitride (the amount of oxygen>the amount of nitrogen), aluminum nitride oxide (the amount of nitrogen>the amount of oxygen), DLC (Diamond Like Carbon), or the like can be used. In a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting device. Furthermore, the polarizing plate or the circularly polarizing plate may be provided with an anti-reflection film. For example, anti-glare treatment by which reflected light can be diffused by projections and depressions on a surface to reduce the glare can be performed.

When the light-emitting device has a microcavity structure, light with high color purity can be extracted. Furthermore, when a microcavity structure and a color filter are combined, the glare can be reduced and the visibility of a displayed image can be increased.

Whether the first electrode layer and the second electrode layer (also referred to as a pixel electrode layer, a common electrode layer, a counter electrode layer, or the like) for applying voltage to the display device have light-transmitting properties or light-reflecting properties may be determined in accordance with the direction in which light is extracted, a position where the electrode layer is provided, and the pattern structure of the electrode layer.

For each of the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added can be used.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Figure 22:
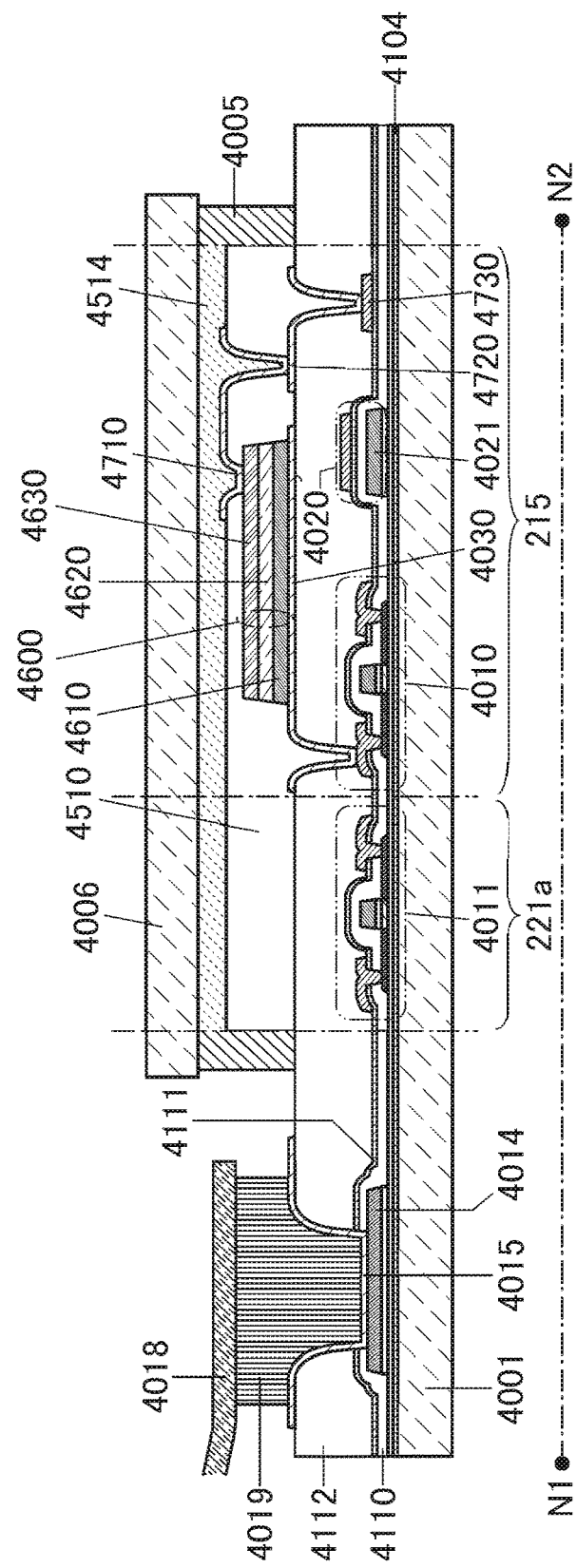
FIG. 22 is a diagram illustrating a display apparatus.

FIG. 22 illustrates an example of a display apparatus in which a micro LED is used as a display device. Note that components that are the same as the components in the structure of FIG. 21 are denoted by the same reference numerals. An LED generally refers to a light-emitting diode, and an LED chip whose one side dimension is larger than 100 μm and smaller than or equal to 1 mm can be called a mini LED and an LED chip whose one side dimension is smaller than or equal to 100 μm can be called a micro LED. The structure in FIG. 22 can be applied to general LEDs regardless of the sizes of the LED chips.

A micro LED 4600 includes a semiconductor layer 4610, a light-emitting layer 4620, and a semiconductor layer 4630. The light-emitting layer 4620 is sandwiched between the semiconductor layer 4610 and the semiconductor layer 4630. In the light-emitting layer 4620, electrons and holes are combined to emit light. An n-type semiconductor layer can be used as the semiconductor layer 4610, and a p-type semiconductor layer can be used as the semiconductor layer 4630. In addition, an n-type semiconductor layer, an i-type semiconductor layer, or a p-type semiconductor layer can be used as the light-emitting layer 4620.

A stacked-layer structure including the semiconductor layer 4610, the light-emitting layer 4620, and the semiconductor layer 4630 is formed to emit red light, green light, blue light, bluish violet light, violet light, ultraviolet light, or the like. For the stacked-layer structure, for example, a compound containing a Group 13 element and a Group 15 element (also referred to as a Group III-V compound) can be used. Examples of the Group 13 element include aluminum, gallium, and indium. Examples of the Group 15 element include nitrogen, phosphorus, arsenic, and antimony.

For example, a pn junction or a pin junction is formed using a compound of gallium and phosphorus, a compound of gallium and arsenic, a compound of gallium, aluminum, and arsenic, a compound of aluminum, gallium, indium, and phosphorus, gallium nitride, a compound of indium and gallium nitride, a compound of selenium and zinc, or the like to form a light-emitting diode emitting target light. Note that a compound other than the above may be also used.

The pn junction or the pin junction may be not only a homojunction but also a heterojunction or a double heterojunction. Alternatively, an LED having a quantum well junction, a nanocolumn LED, or the like may be used.

For example, a material such as gallium nitride can be used for a light-emitting diode emitting light in the ultraviolet wavelength range to the blue wavelength range. A material such as a compound of indium and gallium nitride can be used for a light-emitting diode emitting light in the ultraviolet wavelength range to the green wavelength range. A material such as a compound of aluminum, gallium, indium, and phosphorus or a compound of gallium and arsenic can be used for a light-emitting diode emitting light in the green wavelength range to the red wavelength range. A material such as a compound of gallium and arsenic can be used for a light-emitting diode emitting light in the infrared wavelength range.

With a structure where a plurality of micro LEDs 4600 provided over the same plane can emit light of different colors such as R (red), G (green), and B (blue), for example, a color image can be displayed without using a color conversion layer. Accordingly, a step of forming a color conversion layer is unnecessary, and manufacturing cost of the display apparatus can be reduced.

Alternatively, a structure may be employed in which all micro LEDs 4600 provided over the same plane emit light of the same color. In this case, light emitted from the light-emitting layer 4620 is extracted to the outside of the display apparatus through one or both of a color conversion layer and a coloring layer. Quantum dots can be used for the color conversion layer, for example.

The semiconductor layer 4630 is electrically connected to a wiring layer 4730 through a wiring layer 4710 and a wiring layer 4720. The wiring layer 4730 can supply a cathode potential.

Since the transistor is easily broken by static electricity or the like, a protective circuit for protecting the driver circuit is preferably provided. The protective circuit is preferably formed using a nonlinear element.

Note that the structure illustrated in FIG. 22 can also be used for a backlight of a liquid crystal display apparatus. Overlapping the structure illustrated in FIG. 22 and a pixel including a liquid crystal element can perform local dimming drive, so that display with an extremely high contrast is possible.

This embodiment can be implemented in an appropriate combination with the structures described in the other embodiments.

Embodiment 3

In this embodiment, examples of transistors that can be used as the transistors described in the above embodiments are described with reference to drawings.

The display apparatus according to one embodiment of the present invention can be manufactured using a transistor with various modes, such as a bottom-gate transistor or a top-gate transistor. Therefore, the material of a semiconductor layer and the structure of a transistor can be easily changed depending on the existing production line.

[Bottom-Gate Transistor]

Figure 23A:
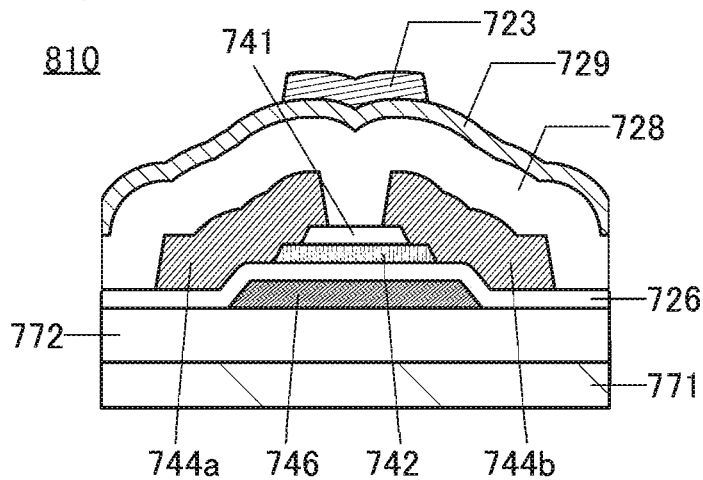
FIG. 23A to FIG. 23C are diagrams illustrating transistors.

FIG. 23A is a cross-sectional view of a channel-protective transistor 810, which is a kind of bottom-gate transistor, in a channel length direction. In FIG. 23A, the transistor 810 is formed over a substrate 771. In addition, the transistor 810 includes an electrode 746 over the substrate 771 with an insulating layer 772 therebetween. The transistor 810 further includes a semiconductor layer 742 over the electrode 746 with an insulating layer 726 therebetween. The electrode 746 can function as a gate electrode. The insulating layer 726 can function as a gate insulating layer.

In addition, an insulating layer 741 is provided over a channel formation region in the semiconductor layer 742. Furthermore, an electrode 744a and an electrode 744b are provided over the insulating layer 726 to be partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b.

In addition, the transistor 810 includes an insulating layer 728 over the electrode 744a, the electrode 744b, and the insulating layer 741 and further includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b that are in contact with the semiconductor layer 742. In a region where oxygen vacancies are generated in the semiconductor layer 742, a carrier concentration is increased; thus, the region becomes n-type to be an n-type region (n+ region). Accordingly, the region can function as a source region or a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

An electrode 723 that can function as a back gate electrode is provided over the insulating layer 729. The electrode 723 can be formed using a material and a method similar to those for the electrode 746. Note that a structure in which the electrode 723 is not provided may be employed.

In general, a back gate electrode is formed using a conductive layer and positioned so that a channel formation region in a semiconductor layer is sandwiched between the gate electrode and the back gate electrode. Thus, the back gate electrode can function in a manner similar to that of the gate electrode. The potential of the back gate electrode may be equal to the potential of the gate electrode or may be a ground potential (GND potential) or a given potential. In addition, when the potential of the back gate electrode is changed without synchronization and independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode," the other is referred to as a "back gate electrode." In the transistor 810, for example, in the case where the electrode 723 is referred to as a "gate electrode," the electrode 746 is referred to as a "back gate electrode." In addition, in the case where the electrode 723 is used as a "gate electrode," the transistor 810 can be regarded as a kind of top-gate transistor. Furthermore, in some cases, one of the electrode 746 and the electrode 723 is referred to as a "first gate electrode," and the other is referred to as a "second gate electrode."

By providing the electrode 746 and the electrode 723 with the semiconductor layer 742 sandwiched therebetween and setting the potential of the electrode 746 equal to the potential of the electrode 723, a region of the semiconductor layer 742 through which carriers flow is enlarged in a film thickness direction; thus, the amount of transferred carriers is increased. As a result, the on-state current of the transistor 810 is increased and the field-effect mobility is increased.

Therefore, the transistor 810 is a transistor having high on-state current for its occupation area. That is, the occupation area of the transistor 810 can be small for required on-state current.

In addition, the gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer so that the semiconductor layer is covered with the back gate electrode, the electric field blocking function can be enhanced.

Furthermore, when the back gate electrode is formed using a light-blocking conductive film, light can be prevented from entering the semiconductor layer from the back gate electrode side. Therefore, photodegradation of the semiconductor layer can be prevented, and degradation in electrical characteristics of the transistor, such as a shift in the threshold voltage, can be prevented.

Figure 23B:
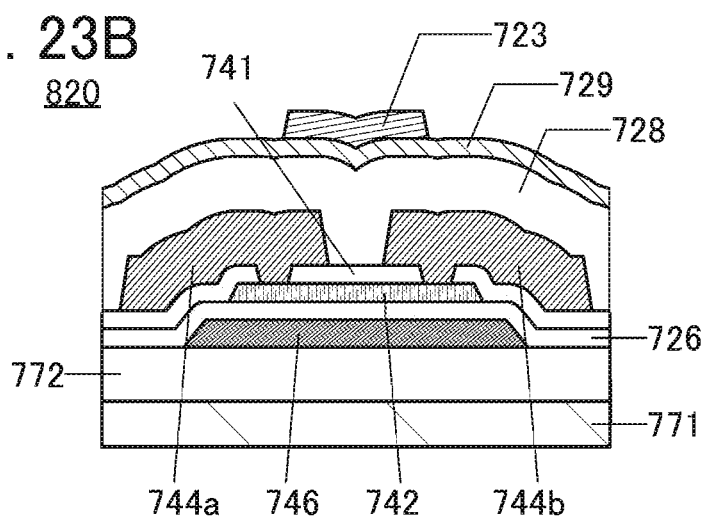

FIG. 23B is a cross-sectional view of a channel-protective transistor 820, which has a structure different from FIG. 23A, in a channel length direction. The transistor 820 has substantially the same structure as the transistor 810 but is different from the transistor 810 in that the insulating layer 741 covers end portions of the semiconductor layer 742. In addition, the semiconductor layer 742 is electrically connected to the electrode 744*a* through an opening portion formed by selectively removing part of the insulating layer 741 that overlaps with the semiconductor layer 742. Furthermore, the semiconductor layer 742 is electrically connected to the electrode 744*b* through another opening portion formed by selectively removing part of the insulating layer 741 that overlaps with the semiconductor layer 742. A region of the insulating layer 741 that overlaps with the channel formation region can function as a channel protective layer.

With the insulating layer 741, the semiconductor layer 742 can be prevented from being exposed at the time of forming the electrode 744*a* and the electrode 744*b*. Thus, the semiconductor layer 742 can be prevented from being reduced in thickness at the time of forming the electrode 744*a* and the electrode 744*b*.

Furthermore, the distance between the electrode 744*a* and the electrode 746 and the distance between the electrode 744*b* and the electrode 746 are longer in the transistor 820 than in the transistor 810. Thus, parasitic capacitance generated between the electrode 744*a* and the electrode 746 can be reduced. Moreover, parasitic capacitance generated between the electrode 744*b* and the electrode 746 can be reduced.

Figure 23C:
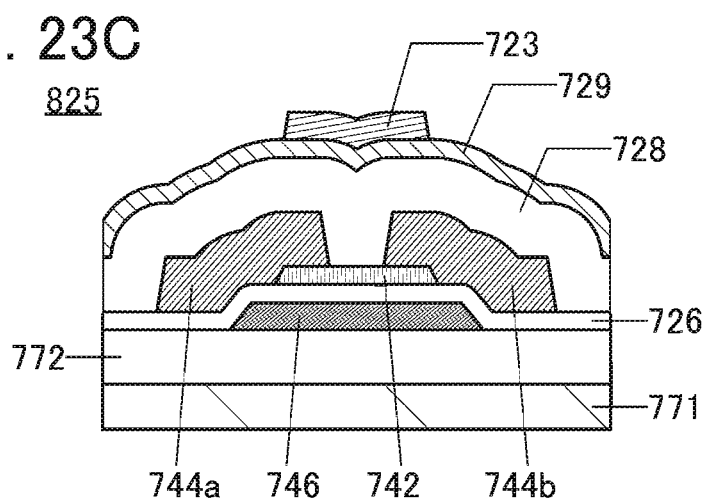

FIG. 23C is a cross-sectional view of a channel-etched transistor 825, which is a kind of bottom-gate transistor, in a channel length direction. In the transistor 825, the electrode 744*a* and the electrode 744*b* are formed without the insulating layer 741. Thus, part of the semiconductor layer 742 that is exposed at the time of forming the electrode 744*a* and the electrode 744*b* might be etched. However, since the insulating layer 741 is not provided, the productivity of the transistor can be increased.

[Top-Gate Transistor]

Figure 24A:
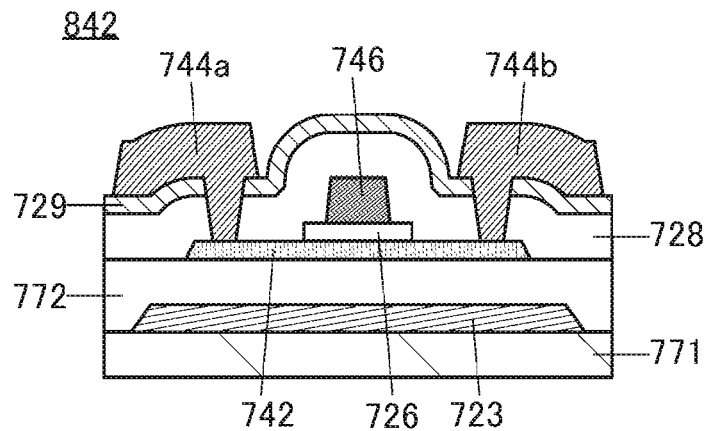
FIG. 24A to FIG. 24C are diagrams illustrating transistors.

A transistor 842 illustrated in FIG. 24A is a kind of top-gate transistor. The electrode 744*a* and the electrode 744*b* are electrically connected to the semiconductor layer 742 through opening portions formed in the insulating layer 728 and the insulating layer 729.

In addition, part of the insulating layer 726 that does not overlap with the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than that of the semiconductor layer 742 in a region into which the impurity is introduced not through the insulating layer 726. Thus, an LDD (Lightly Doped Drain) region is formed in a region of the semiconductor layer 742 that overlaps with the insulating layer 726 but does not overlap with the electrode 746.

In addition, the transistor 842 includes the electrode 723 that is formed over the substrate 771. The electrode 723 includes a region overlapping with the semiconductor layer 742 with the insulating layer 772 therebetween. The electrode 723 can function as a back gate electrode. Note that a structure in which the electrode 723 is not provided may be employed.

Figure 24B:
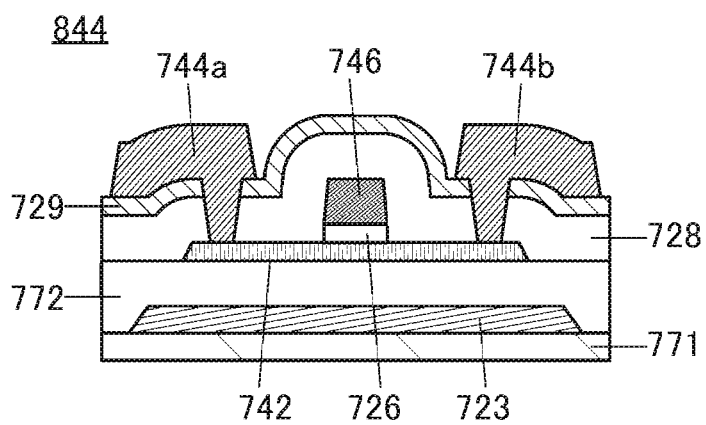
Figure 24C:
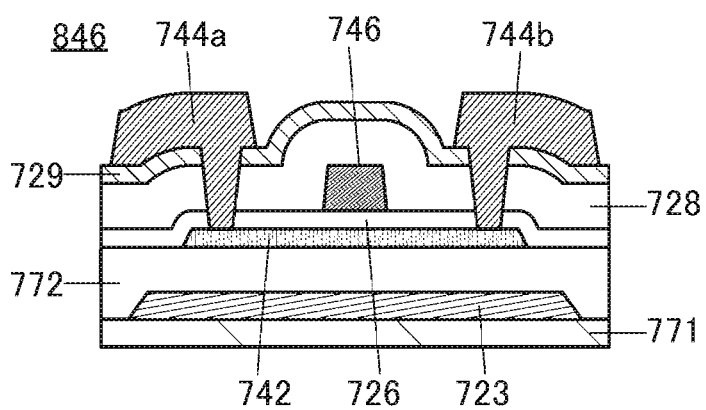

Furthermore, as in a transistor 844 illustrated in FIG. 24B, the insulating layer 726 in a region that does not overlap with the electrode 746 may be completely removed. Alternatively, the insulating layer 726 may be left as in a transistor 846 illustrated in FIG. 24C.

Figure 25A:
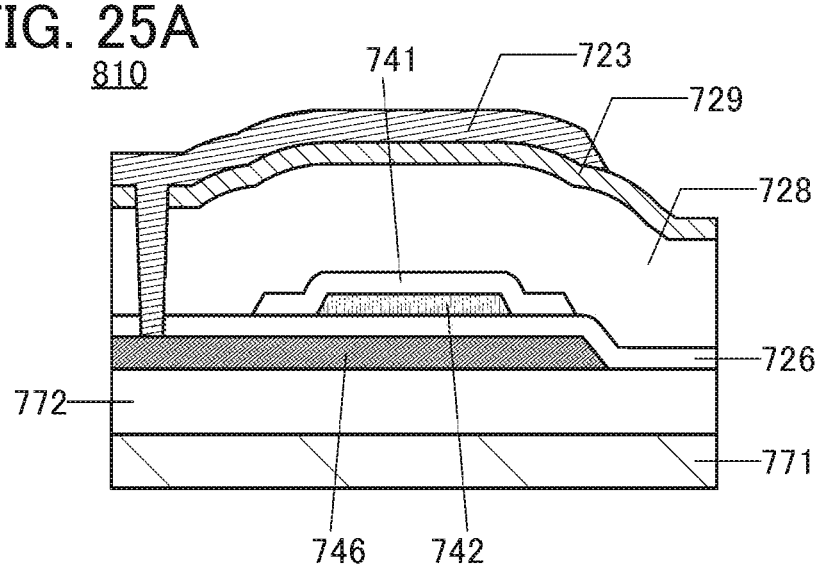
FIG. 25A and FIG. 25B are diagrams illustrating the transistors.
Figure 25B:
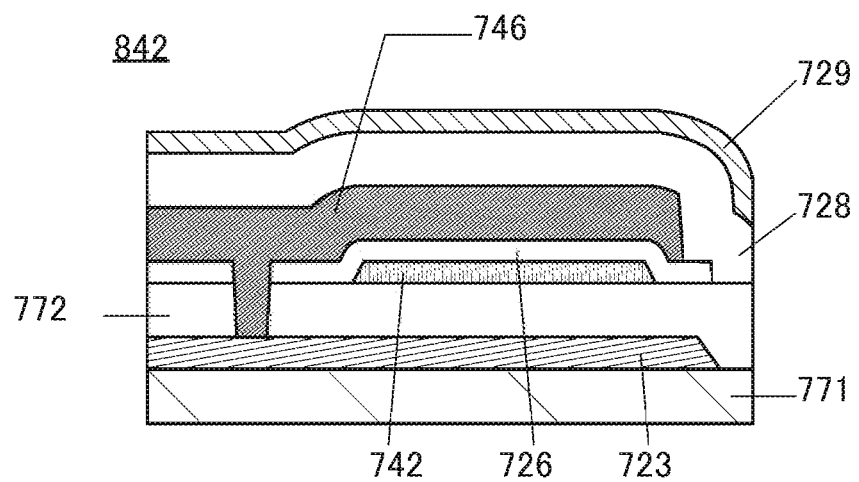

FIG. 25A illustrates a cross-sectional view of the transistor 810 in a channel width direction, and FIG. 25B illustrates a cross-sectional view of the transistor 842 in a channel width direction.

In each of the structures illustrated in FIG. 25A and FIG. 25B, the gate electrode is connected to the back gate electrode, and the potentials of the gate electrode and the back gate electrode are equal to each other. In addition, the semiconductor layer 742 is sandwiched between the gate electrode and the back gate electrode.

The length of each of the gate electrode and the back gate electrode in the channel width direction is larger than the length of the semiconductor layer 742 in the channel width direction. In the channel width direction, the entire semiconductor layer 742 is covered with the gate electrode or the back gate electrode with insulating layers sandwiched therebetween.

This structure enables the semiconductor layer 742 included in the transistor to be electrically surrounded by electric fields of the gate electrode and the back gate electrode.

A transistor device structure in which the semiconductor layer 742 where the channel formation region is formed is electrically surrounded by electric fields of the gate electrode and the back gate electrode in this manner can be referred to as a Surrounded channel (S-channel) structure.

With the S-channel structure, an electric field for inducing a channel can be effectively applied to the semiconductor layer 742 by one or both of the gate electrode and the back gate electrode, which enables the transistor to have an improved current drive capability and high on-state current characteristics. In addition, the transistor can be miniaturized because the on-state current can be increased. The S-channel structure can also increase the mechanical strength of the transistor.

Note that a structure where the gate electrode and the back gate electrode are not connected to each other and are supplied with different potentials may be employed. For example, supplying a constant potential to the back gate electrode can control the threshold voltage of the transistor.

This embodiment can be implemented in an appropriate combination with the structures described in the other embodiments.

Embodiment 4

Examples of an electronic device that can use the display apparatus according to one embodiment of the present invention include display devices, personal computers, image memory devices or image reproducing devices provided with storage media, cellular phones, game machines including portable game machines, portable data terminals, e-book readers, cameras such as video cameras and digital cameras, goggle-type displays (head mounted displays), navigation systems, audio reproducing devices (car audio players, digital audio players, and the like), copiers, facsimiles, printers, multifunction printers, automated teller machines (ATM), and vending machines. FIG. 26A to FIG. 26F illustrate specific examples of these electronic devices.

FIG. 26A illustrates a digital camera, which includes a housing 961, a shutter button 962, a microphone 963, a speaker 967, a display portion 965, operation keys 966, a zoom lever 968, a lens 969, and the like. The display apparatus according to one embodiment of the present invention can be used for the display portion 965.

FIG. 26B illustrates a portable data terminal, which includes a housing 911, a display portion 912, speakers 913, an operation button 914, a camera 919, and the like. A touch panel function of the display portion 912 enables input and output of information. The display apparatus according to one embodiment of the present invention can be used for the display portion 912.

FIG. 26C illustrates a cellular phone, which includes a housing 951, a display portion 952, operation buttons 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. In addition, the housing 951 and the display portion 952 have flexibility and can be used in a bent state as illustrated in the diagram. The display apparatus according to one embodiment of the present invention can be used for the display portion 952.

FIG. 26D illustrates a dashboard camera, which includes a housing 931, a display portion 932, operation buttons 933, microphones 934, a lens 935, an attaching member 936, and the like. The dashboard camera is mounted to the windshield or the like of a motor vehicle by the attaching member 936 so that the dashboard camera can record a front view during driving. An image being recorded can be displayed on the display portion 932. The display apparatus according to one embodiment of the present invention can be employed for the display portion 932.

FIG. 26E illustrates a television, which includes a housing 971, a display portion 973, operation buttons 974, speakers 975, a communication connection terminals 976, an optical sensor 977, and the like. The display portion 973 is provided with a touch sensor, and an input operation can be also performed. The display apparatus according to one embodiment of the present invention can be used for the display portion 973.

FIG. 26F illustrates digital signage, which includes a large display portion 922. The large display portion 922 in the digital signage is attached to a side surface of a pillar 921, for example. The display apparatus according to one embodiment of the present invention can be used for the display portion 922.

This embodiment can be implemented in an appropriate combination with the structures described in the other embodiments.

REFERENCE NUMERALS

Tr1: transistor, Tr2: transistor, Tr3: transistor, Tr4: transistor, Tr5: transistor, 10: pixel, 10a: pixel, 10b: pixel, 11: pixel array, 20: source driver, 30: gate driver, 40: ramp wave signal generation circuit, 101: transistor, 102: transistor, 103: transistor, 104: transistor, 105: transistor, 106: capacitor, 108: light-emitting device, 121: wiring, 122: wiring, 123: wiring, 125: wiring, 126: wiring, 127: wiring, 128: wiring, 129: wiring, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 771: substrate, 772: insulating layer, 810: transistor, 820: transistor, 825: transistor, 842: transistor, 844: transistor, 846: transistor, 911: housing, 912: display portion, 913: speaker, 914: operation button, 919: camera, 921: pillar, 922: display portion, 931: housing, 932: display portion, 933: operation button, 934: microphone, 935: lens, 936: member, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation button, 975: speaker, 976: communication connection terminal, 977: optical sensor, 4001: substrate, 4005: sealant, 4006: substrate, 4010: transistor, 4011: transistor, 4014: wiring, 4015: electrode, 4018: FPC, 4019: anisotropic conductive layer, 4020: capacitor, 4021: electrode, 4030: electrode layer, 4031: electrode layer, 4041: printed circuit board, 4042: integrated circuit, 4104: insulating layer, 4110: insulating layer, 4111: insulating layer, 4112: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4510: partition, 4511: light-emitting layer, 4513: light-emitting device, 4514: filler, 4600: micro LED, 4610: semiconductor layer, 4620: light-emitting layer, 4630: semiconductor layer, 4710: wiring layer, 4720: wiring layer, 4730: wiring layer

The invention claimed is:

1. A display apparatus comprising a pixel comprising:
a first transistor;
a second transistor;
a third transistor;
a fourth transistor;
a fifth transistor;
a capacitor; and
a light-emitting device,
wherein one of a source and a drain of the first transistor is electrically connected to a gate of the second transistor and one electrode of the capacitor,
wherein one of a source and a drain of the second transistor is electrically connected to the other electrode of the capacitor, one of a source and a drain of the third transistor, a gate of the fourth transistor, and one of a source and a drain of the fifth transistor, wherein the other of the source and the drain of the second transistor is electrically connected to a first wiring, wherein one of a source and a drain of the fourth transistor is electrically connected to the light-emitting device, wherein a data potential is supplied to a gate of the second transistor through the first transistor, wherein a gate of the first transistor and a gate of the fifth transistor are electrically connected to a second wiring, and wherein a gate of the third transistor is electrically connected to a third wiring.

2. The display apparatus according to claim 1, wherein the light-emitting device is an LED, and wherein one of the source and the drain of the fourth transistor is electrically connected to a cathode of the LED.

3. The display apparatus according to claim 1, wherein the light-emitting device is an organic EL element, and wherein one of the source and the drain of the fourth transistor is electrically connected to an anode of the organic EL element.

4. The display apparatus according to claim 1, wherein the first transistor contains a metal oxide in a channel formation region, and wherein the metal oxide contains In, Zn, and M, M being one or more kinds selected from Al, Ti, Ga, Ge, Sn, Y, Zr, La, Ce, Nd, and Hf.

5. A display apparatus comprising a pixel comprising:
a first transistor;
a second transistor;
a third transistor;
a fourth transistor;
a capacitor; and
a light-emitting device,
wherein the second transistor is a p-channel transistor,
wherein one of a source and a drain of the first transistor is electrically connected to a gate of the second transistor and one electrode of the capacitor, wherein one of a source and a drain of the second transistor is electrically connected to one of a source and a drain of the third transistor, wherein the other of the source and the drain of the second transistor is electrically connected to the other electrode of the capacitor, wherein the other of the source and the drain of the third transistor is electrically connected to a first power supply line, wherein a gate of the fourth transistor is directly connected to the one of the source and the drain of the second transistor, wherein one of a source and a drain of the fourth transistor is electrically connected to the light-emitting device, wherein the other of the source and the drain of the fourth transistor is electrically connected to the first power supply line, and wherein a data potential is supplied to a gate of the second transistor through the first transistor.

6. The display apparatus according to claim 5, wherein the other electrode of the capacitor is electrically connected to a second power supply line.

7. The display apparatus according to claim 5, wherein the second transistor contains silicon in a channel formation region.

8. The display apparatus according to claim 5, wherein the light-emitting device is an LED, and wherein one of the source and the drain of the fourth transistor is electrically connected to a cathode of the LED.

9. The display apparatus according to claim 5, wherein the light-emitting device is an organic EL element, and wherein one of the source and the drain of the fourth transistor is electrically connected to an anode of the organic EL element.

10. The display apparatus according to claim 5, wherein the first transistor contains a metal oxide in a channel formation region, and wherein the metal oxide contains In, Zn, and M, M being one or more kinds selected from Al, Ti, Ga, Ge, Sn, Y, Zr, La, Ce, Nd, and Hf.

* * * * *